(12) United States Patent
Sasagawa et al.

(10) Patent No.: US 9,691,904 B2
(45) Date of Patent: *Jun. 27, 2017

(54) SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Kanagawa (JP); Motomu Kurata, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/221,656

(22) Filed: Jul. 28, 2016

(65) Prior Publication Data

US 2016/0336457 A1    Nov. 17, 2016

Related U.S. Application Data

(63) Continuation of application No. 14/680,191, filed on Apr. 7, 2015, now Pat. No. 9,419,145, which is a
(Continued)

(30) Foreign Application Priority Data

Jul. 12, 2013  (JP) ................. 2013-146297

(51) Int. Cl.
*H01L 29/786* (2006.01)
*H01L 29/76* (2006.01)
(Continued)

(52) U.S. Cl.
CPC .......... *H01L 29/7869* (2013.01); *H01L 29/24* (2013.01); *H01L 29/263* (2013.01);
(Continued)

(58) Field of Classification Search
CPC .......... H01L 29/7869; H01L 29/78693; H01L 29/78696; H01L 29/24; H01L 29/263; H01L 29/42356; H01L 29/42364
(Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP    1737044 A   12/2006
EP    2226847 A   9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Dao H Nguyen
(74) *Attorney, Agent, or Firm* — Fish & Richardson P.C.

(57) ABSTRACT

To give favorable electrical characteristics to a semiconductor device. The semiconductor device includes an insulating layer, a semiconductor layer over the insulating layer, a pair of electrodes over the semiconductor layer and each electrically connected to the semiconductor layer, a gate electrode over the semiconductor layer, and a gate insulating layer between the semiconductor layer and the gate electrode. The insulating layer includes an island-shaped projecting portion. A top surface of the projecting portion of the insulating layer is in contact with a bottom surface of the semiconductor layer, and is positioned on an inner side of the semiconductor layer when seen from above. The pair of electrodes covers part of a top surface and part of side
(Continued)

surfaces of the semiconductor layer. Furthermore, the gate electrode and the gate insulating layer cover side surfaces of the projecting portion of the insulating layer.

21 Claims, 11 Drawing Sheets

Related U.S. Application Data continuation of application No. 14/321,515, filed on Jul. 1, 2014, now Pat. No. 9,006,736.

(51) Int. Cl.
H01L 29/26 (2006.01)
H01L 29/24 (2006.01)
H01L 29/423 (2006.01)

(52) U.S. Cl.
CPC .. *H01L 29/42356* (2013.01); *H01L 29/42364* (2013.01); *H01L 29/78693* (2013.01); *H01L 29/78696* (2013.01); *H01L 29/247* (2013.01)

(58) Field of Classification Search
USPC ........ 257/40, 43, 57, 59, 288, 613, E29.068, 257/E29.273, E21.104, E21.409; 438/104, 109, 151, 250, 270
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,037,790 B2 | 5/2006 | Chang et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,504,678 B2 | 3/2009 | Chau et al. | |
| 7,674,650 B2 | 3/2010 | Akimoto et al. | |
| 7,732,819 B2 | 6/2010 | Akimoto et al. | |
| 8,089,117 B2 | 1/2012 | Shimizu | |
| 8,502,221 B2 | 8/2013 | Yamazaki | |
| 8,530,285 B2 | 9/2013 | Yamazaki et al. | |
| 8,592,879 B2* | 11/2013 | Suzawa | H01L 27/1214 257/288 |
| 8,754,409 B2 | 6/2014 | Yamazaki et al. | |
| 8,803,203 B2 | 8/2014 | Tutt et al. | |
| 9,006,736 B2* | 4/2015 | Sasagawa | H01L 29/7869 257/288 |
| 9,076,874 B2 | 7/2015 | Yamazaki et al. | |
| 9,214,474 B2 | 12/2015 | Yamazaki | |
| 9,287,408 B2 | 3/2016 | Yamazaki et al. | |
| 9,419,145 B2* | 8/2016 | Sasagawa | H01L 29/7869 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0035415 A1 | 2/2005 | Yeo et al. | |
| 2005/0199959 A1 | 9/2005 | Chiang et al. | |
| 2006/0027870 A1 | 2/2006 | Inaba | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0075372 A1 | 4/2007 | Terashima et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0240991 A1 | 10/2011 | Yamazaki | |
| 2012/0001178 A1 | 1/2012 | Miyairi et al. | |
| 2012/0187396 A1* | 7/2012 | Yamazaki | H01L 29/66742 257/43 |
| 2012/0187397 A1 | 7/2012 | Yamazaki et al. | |
| 2012/0211755 A1 | 8/2012 | Fujimori et al. | |
| 2012/0267624 A1* | 10/2012 | Isobe | H01L 27/0688 257/43 |
| 2013/0313550 A1 | 11/2013 | Yamazaki | |
| 2013/0320330 A1 | 12/2013 | Yamazaki | |

(56) References Cited

U.S. PATENT DOCUMENTS

| | | | |
|---|---|---|---|
| 2013/0320334 A1 | 12/2013 | Yamazaki et al. | |
| 2014/0008647 A1* | 1/2014 | Yamazaki | H01L 29/7869 257/43 |
| 2014/0042433 A1 | 2/2014 | Yamazaki | |
| 2014/0077205 A1 | 3/2014 | Yamazaki et al. | |
| 2014/0103339 A1* | 4/2014 | Yamazaki | H01L 29/78693 257/43 |
| 2015/0021596 A1* | 1/2015 | Yamazaki | H01L 29/78693 257/43 |
| 2015/0034949 A1 | 2/2015 | Yamazaki | |
| 2015/0287837 A1 | 10/2015 | Yamazaki et al. | |
| 2015/0380417 A1 | 12/2015 | Yamazaki et al. | |
| 2016/0079431 A1 | 3/2016 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-049627 A | 2/2006 |
| JP | 2007-073663 A | 3/2007 |
| JP | 2007-096055 A | 4/2007 |
| JP | 2007-123861 A | 5/2007 |
| JP | 2007-173527 A | 7/2007 |
| JP | 2011-228695 A | 11/2011 |
| JP | 2011-243745 A | 12/2011 |
| JP | 2012-216802 A | 11/2012 |
| JP | 2013-021313 A | 1/2013 |
| JP | 2013-038400 A | 2/2013 |
| WO | WO-2004/114391 | 12/2004 |
| WO | WO-2005/038931 | 4/2005 |
| WO | WO-2011/122364 | 10/2011 |
| WO | WO-2012/172746 | 12/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Empoying MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

(56) References Cited

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposuim Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner 101 106    102 110    103    110 102

101 106    102 110    103    110 102

101 106    102 110    103    110 102

SEMICONDUCTOR DEVICE

CROSS-REFERENCE TO RELATED APPLICATIONS

This application is a continuation of U.S. application Ser. No. 14/680,191, filed Apr. 7, 2015, now allowed, which is a continuation of U.S. application Ser. No. 14/321,515, filed Jul. 1, 2014, now U.S. Pat. No. 9,006,736, which claims the benefit of a foreign priority application filed in Japan as Serial No. 2013-146297 on Jul. 12, 2013, all of which are incorporated by reference.

BACKGROUND OF THE INVENTION

1. Field of the Invention

The present invention relates to a semiconductor device.

In this specification, a semiconductor device designates all types of devices that can function by utilizing semiconductor characteristics; a transistor, a semiconductor circuit, an arithmetic unit, a memory device, an imaging device, an electro-optical device, a power generation device (e.g., a thin film solar cell and an organic thin film solar cell), and an electronic device are each an embodiment of the semiconductor device.

2. Description of the Related Art

Attention has been focused on a technique for formation of a transistor using a semiconductor thin film formed over a substrate having an insulating surface. The transistor is used in a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique for formation of a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices.

REFERENCE

Patent Document

[Patent Document 1] Japanese Published Patent Application No. 2007-123861

[Patent Document 2] Japanese Published Patent Application No. 2007-096055

SUMMARY OF THE INVENTION

An object of one embodiment of the present invention is to give favorable electrical characteristics to a semiconductor device.

Another object of one embodiment of the present invention is to provide a semiconductor device that is suitable for miniaturization. Another object of one embodiment of the present invention is to provide a highly reliable semiconductor device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an insulating layer, an island-shaped semiconductor layer over the insulating layer, a pair of electrodes that are separated from each other over the semiconductor layer and electrically connected to the semiconductor layer, a gate electrode over the semiconductor layer, and a gate insulating layer between the semiconductor layer and the gate electrode. The insulating layer includes an island-shaped projecting portion. A top surface of the projecting portion of the insulating layer is in contact with a bottom surface of the semiconductor layer, and is positioned inside an outline of the semiconductor layer when seen from above (in other words, in a plan view). The pair of electrodes covers part of a top surface and part of side surfaces of the semiconductor layer. Furthermore, the gate electrode and the gate insulating layer in a region that does not overlap with the pair of electrodes cover the top surface and the side surfaces of the semiconductor layer and side surfaces of the projecting portion of the insulating layer.

The semiconductor layer preferably contains an oxide semiconductor.

One embodiment of the present invention is a semiconductor device including an insulating layer, an island-shaped semiconductor layer over the insulating layer, a pair of electrodes that are separated from each other over the semiconductor layer and electrically connected to the semiconductor layer, a gate electrode over the semiconductor layer, a gate insulating layer between the semiconductor layer and the gate electrode, a first oxide layer between the semiconductor layer and the insulating layer, and a second oxide layer between the semiconductor layer and the gate insulating layer. The insulating layer includes an island-shaped projecting portion. A top surface of the projecting portion of the insulating layer is in contact with a bottom surface of the first oxide layer, and is positioned inside an outline of at least one of the semiconductor layer, the first oxide layer, and the second oxide layer when seen from above (in other words, in a plan view). The pair of electrodes covers part of a top surface and part of side surfaces of the semiconductor layer. Furthermore, the gate electrode and the gate insulating layer in a region that does not overlap with the pair of electrodes cover the top surface and the side surfaces of the semiconductor layer and side surfaces of the projecting portion of the insulating layer.

The semiconductor layer preferably contains an oxide semiconductor. Each of the first oxide layer and the second oxide layer preferably contains one or more of the metal elements contained in the oxide semiconductor.

In the above structure, the first oxide layer preferably has an island shape which is substantially aligned with the shape of the semiconductor layer when seen from above. The second oxide layer in a region that does not overlap with the pair of electrodes preferably covers the top surface and the side surfaces of the semiconductor layer, side surfaces of the first oxide layer, and the side surfaces of the projecting portion of the insulating layer.

The thickness of the semiconductor layer is preferably 0.1 times or more and 10 times or less as large as the channel width.

The sum of the thicknesses of the first oxide layer, the semiconductor layer, and the second oxide layer is preferably 0.1 times or more and 10 times or less as large as the channel width. The semiconductor layer is preferably thicker than the first oxide layer and the second oxide layer.

Part of a bottom surface of the gate electrode is preferably positioned below the top surface of the projecting portion.

Note that in this specification, the expression "shapes substantially aligned with each other when seen from above" means that at least outlines of stacked layers partly overlap with each other. For example, the case of patterning or partly patterning an upper layer and a lower layer with the use of the same mask pattern is included in the expression. The expression "shapes substantially aligned with each other when seen from above" includes the case where the outlines do not completely overlap with each other; for example, an end portion of an upper layer may be positioned on an inner side of an end portion of a lower layer, or may be positioned on an outer side of the end portion of the lower layer.

One embodiment of the present invention makes it possible to provide a semiconductor device having favorable electrical characteristics. A semiconductor device suitable for miniaturization can also be provided. A highly reliable semiconductor device can also be provided.

DETAILED DESCRIPTION OF THE INVENTION

Figure 1A:
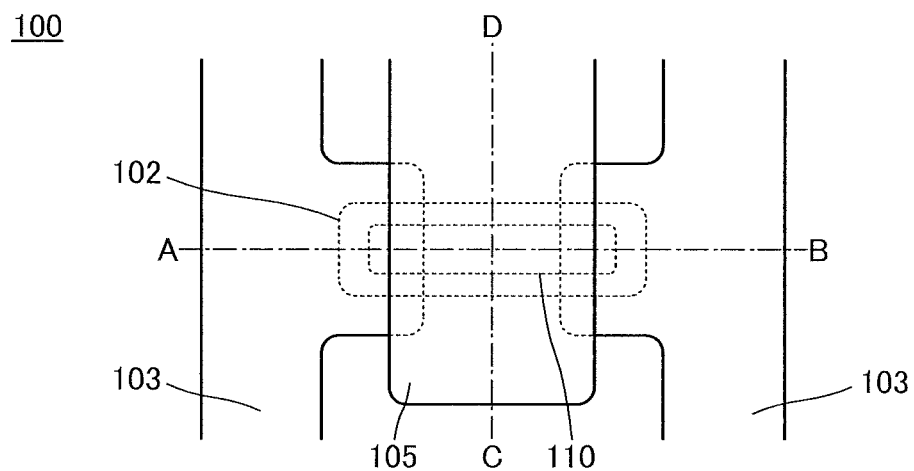
FIGS. 1A to 1C illustrate a structural example of a semiconductor device of an embodiment.

Embodiments will be described in detail with reference to drawings. Note that the present invention is not limited to the description below, and it is easily understood by those skilled in the art that modes and details of the present invention can be modified in various ways without departing from the spirit and scope of the present invention. Therefore, the invention should not be construed as being limited to the description in the following embodiments.

Note that in the structures of the invention described below, the same portions or portions having similar functions are denoted by the same reference numerals in different drawings, and description of such portions is not repeated. Furthermore, the same hatching pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor element and can achieve amplification of current or voltage, switching operation for controlling conduction and non-conduction, or the like. A transistor in this specification includes an insulated-gate field effect transistor (IGFET) and a thin film transistor (TFT) in its category.

(Embodiment 1)

In this embodiment, structural examples of a transistor as a semiconductor device of one embodiment of the present invention, and an example of a method for manufacturing the transistor are described with reference to drawings.

[Structural Example]

Figure 1B:
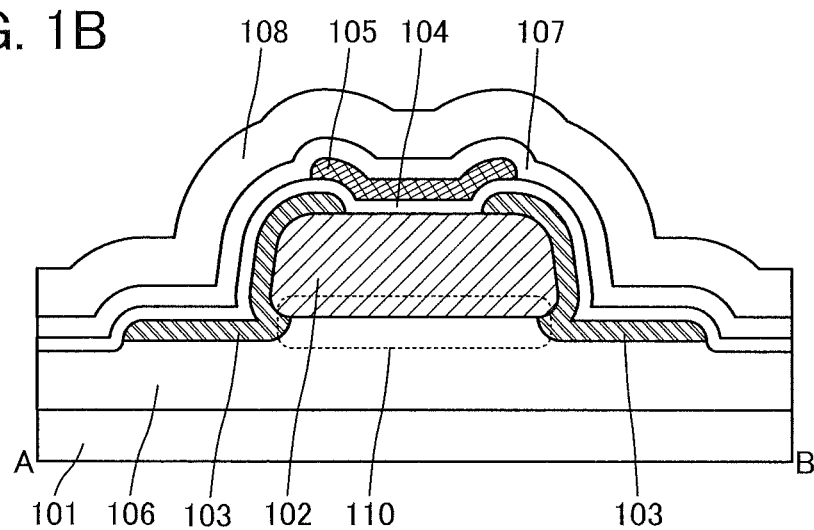
Figure 1C:
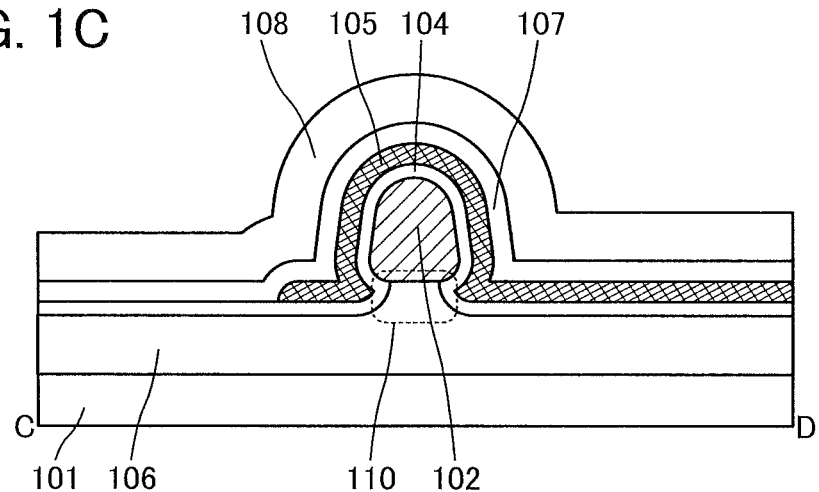

FIG. 1A is a schematic top view (a plan view) of a transistor 100 described in this structural example. FIG. 1B is a schematic cross-sectional view taken along line A-B in FIG. 1A, and FIG. 1C is a schematic cross-sectional view taken along line C-D in FIG. 1A. Note that some components are not illustrated in FIG. 1A for simplicity.

The transistor 100 is provided over a substrate 101 and includes an insulating layer 106, an island-shaped semiconductor layer 102 over the insulating layer 106, a pair of electrodes 103 over the semiconductor layer 102, a gate electrode 105 over the semiconductor layer 102, and an insulating layer 104 between the semiconductor layer 102 and the gate electrode 105. The transistor 100 further includes an insulating layer 107 covering the pair of electrodes 103, the semiconductor layer 102, the insulating layer 104, and the gate electrode 105, and an insulating layer 108 over the insulating layer 107.

The insulating layer 106 includes an island-shaped projecting portion 110. The semiconductor layer 102 is provided to be in contact with a top surface of the projecting portion 110. The projecting portion 110 is provided so that the top surface thereof is positioned on an inner side of the semiconductor layer 102 when seen from above (in other word, in a plan view). In other words, the projecting portion 110 of the insulating layer 106 is provided so that the outline of the top surface thereof is positioned on an inner side of the outline of the semiconductor layer 102 when seen from above.

The semiconductor layer 102 may contain a semiconductor such as a silicon-based semiconductor in a region where a channel is formed. It is preferable that the semiconductor layer 102 contains a semiconductor having a wider band gap than silicon. The semiconductor layer 102 is preferably formed using an oxide semiconductor.

The oxide semiconductor preferably contains at least indium (In) or zinc (Zn), for example. It is more preferable that an In—M—Zn-based oxide (M is a metal such as Al, Ti, Ga, Ge, Y, Zr, Sn, La, Ce, or Hf) be used as the oxide semiconductor.

Description is given below of the case where the semiconductor layer 102 contains an oxide semiconductor unless otherwise noted.

One of the pair of electrodes 103 serves as a source electrode and the other serves as a drain electrode.

Here, a direction parallel to the direction in which current flows through the semiconductor layer 102 is referred to as a channel length direction, and a direction perpendicular to the channel length direction is referred to as a channel width direction. Accordingly, FIG. 1B corresponds to a schematic cross-sectional view of the transistor 100 in the channel length direction, and FIG. 1C corresponds to a schematic cross-sectional view of the transistor 100 in the channel width direction. In addition, the term "channel length L" refers to the distance between the electrodes 103 in a region overlapping with the semiconductor layer 102 when the transistor 100 is seen from above. The term "channel width W" refers to the width of the semiconductor layer 102 in the direction perpendicular to the channel length direction in a region sandwiched between the pair of electrodes 103 when the transistor 100 is seen from above. Note that the minimum channel length and the minimum channel width are used in the case where the channel length L and the channel width W are not uniform in the transistor 100.

The pair of electrodes 103 is provided to be in contact with part of a top surface, side surfaces, and lower end portions of the semiconductor layer 102 in the channel length direction. Thus, the pair of electrodes 103 is provided along end portions of the semiconductor layer 102 to increase the area of contact between the electrodes 103 and the semiconductor layer 102 and decrease the contact resistance therebetween. Consequently, source-drain current of the transistor 100 in an on state (hereinafter referred to as on-state current) can be increased.

The insulating layer 104 serves as a gate insulating layer. The insulating layer 104 is provided to cover the top surface, the side surfaces, and the lower end portions of the semiconductor layer 102 in the channel width direction.

The gate electrode 105 is provided to cover the top surface, the side surfaces, and the lower end portions of the semiconductor layer 102 in the channel width direction like the insulating layer 104.

Figure 2:
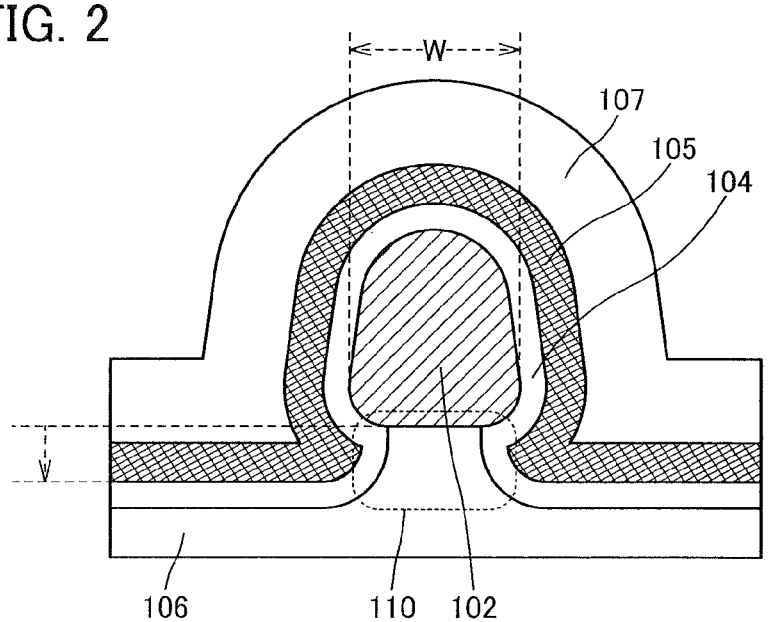
FIG. 2 illustrates the structural example of the semiconductor device of the embodiment.

Here, FIG. 2 illustrates a schematic cross-sectional view in which part of FIG. 1C is enlarged.

As illustrated in FIG. 2, in a cross section in the channel width direction, the gate electrode 105 is preferably provided to surround not only the top surface and the side surfaces of the semiconductor layer 102 but also part of a surface of the semiconductor layer 102 in a downward direction (lower end portions). With such a structure, an electric field can be applied from not only the top surface side and the side surface side but also from the lower end portion sides of the semiconductor layer 102 by the gate electrode 105. Consequently, a channel formed in the vicinity of the side surfaces and the vicinity of the lower end portions of the semiconductor layer 102 can be efficiently used, resulting in an improvement in the field-effect mobility of the transistor 100.

Specifically, as shown by an arrow in FIG. 2, a bottom surface of the gate electrode 105 is preferably positioned below a bottom surface of the semiconductor layer 102 (is preferably closer to the insulating layer 106 than the bottom surface of the semiconductor layer 102 is). Alternatively, the gate electrode 105 and the insulating layer 104 are preferably provided to cover side surfaces of the projecting portion 110 of the insulating layer 106.

Furthermore, because the gate electrode 105 covers the side surfaces of the semiconductor layer 102 in the channel width direction, an effective channel width is increased as the semiconductor layer 102 gets thicker, resulting in an increase in the on-state current. The thickness of the semiconductor layer 102 may be set in consideration of coverage of the semiconductor layer 102 with a film provided thereon or productivity. For example, the thickness of the semiconductor layer 102 is preferably 0.1 times or more and 10 times or less, more preferably 0.5 times or more and 5 times or less, still more preferably 1 time or more and 2 times or less as large as the channel width W.

When the side surfaces of the semiconductor layer 102 are tapered as illustrated in FIG. 2, a film provided over the semiconductor layer 102 can adequately cover the semiconductor layer 102. In addition, corners of the top surface, upper end portions, the lower end portions, and the like of the semiconductor layer 102 are preferably rounded, in which case a film provided over the semiconductor layer 102 can adequately cover the semiconductor layer 102. With the semiconductor layer 102 processed into such a shape, the thickness of the semiconductor layer 102 can be further increased.

For the insulating layer 106, an insulating material containing oxide is preferably used. In particular, an insulating material from which oxygen can be partly released by heating is preferably used. With the use of such a material for the insulating layer 106, oxygen is released by heat applied in a manufacturing process and supplied to the semiconductor layer 102, resulting in reduction of oxygen vacancies in the semiconductor layer 102.

A large number of oxygen vacancies in an oxide semiconductor including a channel formation region of a transistor lead to generation of electrons that are carriers in the channel formation region, which causes defects in electrical characteristics; for example, threshold voltages of transistors vary, leakage current increases, or the threshold voltage changes due to stress application.

Reduction of oxygen vacancies in the semiconductor layer 102 allows the transistor 100 to have favorable electrical characteristics and a change in the electrical characteristics to be reduced, so that the transistor 100 can have high reliability.

For the insulating layer 107 or the insulating layer 108, a material through which oxygen is transmitted with difficulty (relatively impermeable to oxygen) is preferably used. When the semiconductor layer 102 is covered with the insulating layer 107 or the insulating layer 108 using such a material, oxygen can be inhibited from being released from the semiconductor layer 102 to the outside. Furthermore, oxygen released from the insulating layer 106 can be trapped below the insulating layer 107 or the insulating layer 108, resulting in an increase in the amount of oxygen to be supplied to the semiconductor layer 102.

For the insulating layer 107 or the insulating layer 108, a material relatively impermeable to water or hydrogen is preferably used. The use of such a material can inhibit water or hydrogen, which is an impurity of an oxide semiconductor, from entering the semiconductor layer 102 from the outside; therefore, a change in the electrical characteristics of a transistor can be suppressed and the transistor can have high reliability.

Here, a material from which oxygen is released by heating, which is used for the insulating layer 106, is also used for the insulating layer 107 and a material relatively impermeable to oxygen is used for the insulating layer 108; thus, oxygen can be supplied to the semiconductor layer 102 also from the insulating layer 107.

As described above, the semiconductor layer 102 is provided over the projecting portion 110 of the insulating layer 106, and the gate electrode 105 is provided to cover the top surface, the side surfaces, and the lower end portions of the semiconductor layer 102 in the channel width direction; thus, the electrical characteristics such as the on-state current of the transistor 100 can be favorable. Furthermore, the semiconductor layer 102 is formed to have large thickness, which makes it possible for even a miniaturized transistor to have high on-state current.

[Components]

Components of the transistor 100 are described below.

[Semiconductor Layer]

As a semiconductor that can be used for the semiconductor layer in which a channel of the transistor is forming, for example, a semiconductor material such as silicon or germanium, a compound semiconductor material, an organic semiconductor material, or an oxide semiconductor material may be used.

There is no particular limitation on the crystallinity of a semiconductor used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of where silicon is used as the semiconductor, amorphous silicon, microcrystalline silicon, polycrystalline silicon, single crystal silicon, or the like can be used.

Using an oxide semiconductor as a semiconductor contained in the semiconductor layer is particularly preferable. A semiconductor material having a wider band gap and a lower carrier density than silicon is preferably used because off-state leakage current of the transistor can be reduced.

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Note that details of a preferable mode and a formation method of an oxide semiconductor that can be used for the semiconductor layer are described later in Embodiment 3.

[Substrate]

There is no particular limitation on the property of a material and the like of the substrate 101 as long as the material has heat resistance high enough to withstand at least heat treatment in the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon or silicon carbide, an SOI substrate, or the like can be used.

Still alternatively, any of the above-described semiconductor substrates or the SOI substrate provided with a semiconductor element may be used as the substrate 101. In this case, the transistor 100 is formed over the substrate 101 with an interlayer insulating layer provided therebetween. The transistor 100 in this case may have a structure in which at least one of the gate electrode 105 and the pair of electrodes 103 is electrically connected to the above semiconductor element by a connection electrode embedded in the interlayer insulating layer. The transistor 100 is provided over the semiconductor element with the interlayer insulating layer provided therebetween; thus, an occupation area can be smaller than that in the case where the interlayer insulating layer and the semiconductor element are formed over the same surface.

[Gate Electrode]

The gate electrode 105 can be formed using a metal selected from aluminum, chromium, copper, tantalum, titanium, molybdenum, and tungsten; an alloy containing any of these metals as a component; an alloy containing any of these metals in combination; or the like. Alternatively, a nitride of any of the above metals or the above alloy may be used. Manganese or zirconium may be used as the metal. Further alternatively, a semiconductor typified by polycrystalline silicon doped with an impurity element such as phosphorus, or a silicide such as nickel silicide may be used. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film that contains aluminum and one or more metals selected from titanium, tantalum, tungsten, molybdenum, chromium, neodymium, and scandium may be used.

[Gate Insulating Layer]

The insulating layer 104 can be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

Alternatively, the insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide.

[Pair of Electrodes]

The pair of electrodes 103 is formed to have a single-layer structure or a stacked-layer structure using, for example, any of metals such as aluminum, titanium, chromium, nickel, copper, yttrium, zirconium, molybdenum, silver, tantalum, and tungsten and an alloy containing any of these metals as a main component. Alternatively, a nitride of any of the above metals or the above alloy may be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

[Insulating Layer]

As an insulating material from which oxygen is released by heating, an oxide insulating film containing more oxygen than the stoichiometric composition is preferably used. Part of oxygen is released by heating from the oxide insulating film containing more oxygen than the stoichiometric composition. The oxide insulating film containing more oxygen than the stoichiometric composition is an oxide insulating film in which the amount of released oxygen converted into oxygen atoms is greater than or equal to $1.0 \times 10^{18}$ atoms/$cm^3$, preferably greater than or equal to $3.0 \times 10^{20}$ atoms/$cm^3$ in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C.

As such a material, a material containing silicon oxide or silicon oxynitride is preferably used. Note that in this specification, silicon oxynitride refers to a material which has a higher proportion of oxygen content than nitrogen, and silicon nitride oxide refers to a material which has a higher proportion of nitrogen content than oxygen.

With the use of such an insulating film as the insulating layer 106 or the insulating layer 107, oxygen is supplied to the semiconductor layer 102 through heat treatment or the like in the manufacturing process, which makes it possible to reduce oxygen vacancies in the semiconductor layer 102.

As the material relatively impermeable to oxygen, an insulating material such as silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used. In particular, the insulating material is relatively impermeable to hydrogen and water in addition to oxygen. With the use of such a material for the insulating layer 107 or the insulating layer 108, it is possible to inhibit both diffusion of oxygen from the semiconductor layer 102 to the outside and entry of hydrogen, water, or the like from the outside into the semiconductor layer 102 or the like.

Note that when a material relatively impermeable to oxygen, hydrogen, water, or the like is used for the insulating layer 107, a structure in which the insulating layer 108 is not provided may be employed. In the case of providing a component such as a wiring over the insulating layer 108, the insulating layer 108 can serve as a planarization layer.

In addition, an insulating layer containing a material relatively impermeable to oxygen, hydrogen, water, or the like may be provided between the insulating layer 106 and the substrate 101. With such an insulating layer, impurities in the substrate 101 can be inhibited from being diffused into the semiconductor layer 102 or the like. Furthermore, oxygen released from the insulating layer 106 can be inhibited from being diffused into the substrate 101 side, resulting in an increase in the amount of oxygen to be supplied to the semiconductor layer 102.

The above is the descriptions of the components.

[Manufacturing Method Example]

An example of a method for manufacturing the transistor 100 described in the above structural example is described below with reference to drawings. FIGS. 3A to 3E and FIGS. 4A to 4C are schematic cross-sectional views of some steps in the manufacturing method described below. In each of FIGS. 3A to 3E and FIGS. 4A to 4C, a schematic cross section in the channel length direction is illustrated on the left, and the schematic cross-sectional view in the channel width direction is illustrated on the right; the boundary between the left and right sections is shown by the dashed line.

[Formation of Insulating Layer]

Figure 3A:
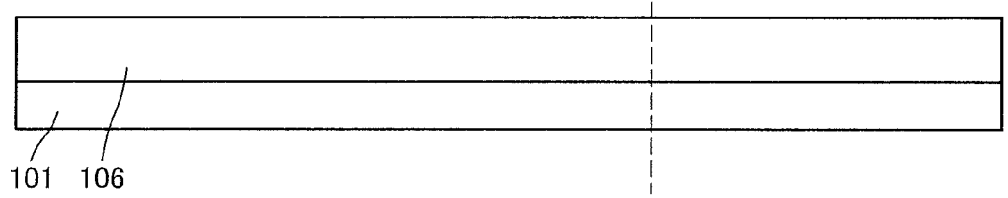
FIGS. 3A to 3E illustrate an example of a method for manufacturing a semiconductor device of an embodiment.

First, the insulating layer 106 is formed over the substrate 101 (FIG. 3A).

The insulating layer 106 is formed by a sputtering method, a chemical vapor deposition (CVD) method, an evaporation method, or the like.

In order to make the insulating layer 106 excessively contain oxygen (i.e. more oxygen than in the stoichiometric composition), the insulating layer 106 may be formed in an oxygen atmosphere, for example. Alternatively, a region excessively containing oxygen may be formed by introducing oxygen into the insulating layer 106 that has been formed. Both the methods may be combined.

For example, oxygen (at least including any of oxygen radicals, oxygen atoms, and oxygen ions) is introduced into the insulating layer 106 that has been formed, whereby a region excessively containing oxygen is formed. Oxygen can be introduced by an ion implantation method, an ion doping method, a plasma immersion ion implantation method, plasma treatment, or the like.

A gas containing oxygen can be used for oxygen introduction treatment. As the gas containing oxygen, oxygen, dinitrogen monoxide, nitrogen dioxide, carbon dioxide, carbon monoxide, and the like can be used. A rare gas may be included in the gas containing oxygen for the oxygen introduction treatment.

[Formation of Semiconductor Film]

Figure 3B:
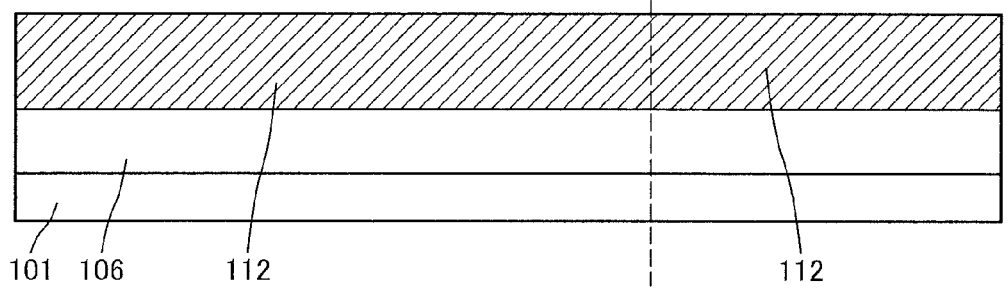

Next, a semiconductor film 112 is formed over the insulating layer 106 (FIG. 3B).

The semiconductor film 112 can be formed by a sputtering method, a CVD method, a molecular beam epitaxy (MBE) method, an atomic layer deposition (ALD) method, a pulsed laser deposition (PLD) method, or the like. Alternatively, a technique for formation of a thin film using a liquid material, such as a sol-gel method, a spray method, or a mist method, can be used. The semiconductor film 112 is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Heat treatment may be performed after the formation of the semiconductor film 112. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidization gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the insulating layer 106 to the semiconductor film 112, which enables a reduction in oxygen vacancies in the oxide semiconductor included in the semiconductor film 112. Note that the heat treatment may be performed directly after the formation of the semiconductor film 112 or may be performed after the semiconductor film 112 is processed into the island-shaped semiconductor layer 102.

[Formation of Etching Mask]

Next, a mask for etching (etching mask) is formed over the semiconductor film 112. Here, description is given of the case where a hard mask is used as the mask. The hard mask is preferably used because variations in shape can be reduced at the time of processing the semiconductor film 112 minutely. The use of the hard mask is effective particularly in the case of the semiconductor film 112 having large thickness. Note that in the case where the hard mask does not need to be used, a resist containing an organic material may be formed directly on the semiconductor film 112 and used as an etching mask.

An inorganic film or a metal film serving as a hard mask 121 in a later step is formed over the semiconductor film 112 first. Here, as a material for the inorganic film or the metal film, it is preferable to use a material with which the etching selectivity of the semiconductor film 112 to the inorganic film or the metal film is high in a later etching step.

As a material of the inorganic film, an oxide such as silicon oxide or aluminum oxide, a nitride such as silicon nitride, or the like can be used. As a material of the metal film, a metal selected from titanium, molybdenum, tantalum, and tungsten; an alloy containing any of the metals as a component; an alloy containing any of the metals in combination; or the like can be used. Alternatively, a nitride of any of the metals may be used.

In the case of using the inorganic film, the inorganic film can be formed by a sputtering method, a CVD method, an MBE method, an ALD method, or a PLD method, for example. In the case of using the metal film, the metal film can be formed by a sputtering method, an evaporation method, a CVD method, or the like, for example.

Figure 3C:
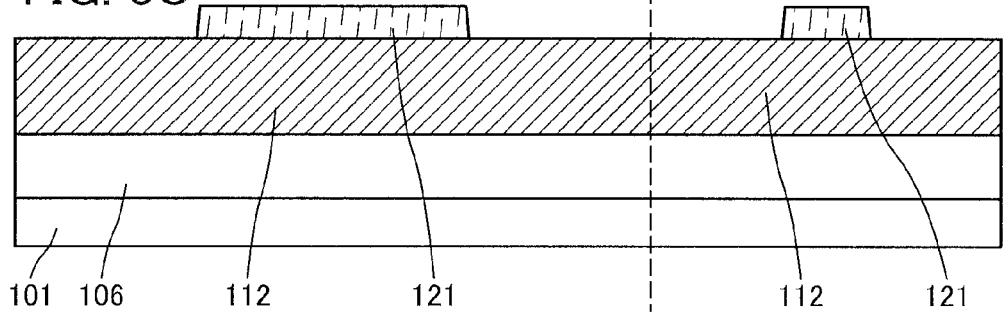

Next, a resist mask is formed over the inorganic film or the metal film by photolithography or the like. An unnecessary portion of the inorganic film or the metal film is removed by etching. Then, the resist mask is removed. Thus, the hard mask 121 can be formed over the semiconductor film 112 (FIG. 3C).

For example, a tungsten film is used as a film serving as the hard mask 121, and the tungsten film is etched by dry etching. In this case, a fluorocarbon-based gas such as $CF_4$, a chlorine-based gas such as $Cl_2$, a mixed gas containing any of these gases and oxygen, or the like can be used in the etching.

Note that the resist mask is not necessarily removed at this stage. When the resist mask is removed at this stage, impurities such as carbon contained in the resist mask in etching the semiconductor film 112 can be inhibited from being attached to a surface of the semiconductor layer 102 after the processing.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

An organic resin film having a function of improving adhesion between the film to be processed (here, the inorganic film or the metal film) and a resist film may be formed before the resist film serving as a resist mask is formed. The organic resin film can be formed by a spin-coating method or the like, for example, to cover the unevenness thereunder, thereby reducing variations in thickness of the resist mask to be provided over the organic resin film. In a particularly minute process, the organic resin film is preferably formed using a material functioning as an anti-reflection film against light for exposure. Examples of such an organic resin film serving as an anti-reflection film include a bottom anti-reflection coating (BARC) film. The organic resin film may be removed at the same time as the removal of the resist mask or after the resist mask is removed.

[Formation of Semiconductor Layer]

Figure 3D:
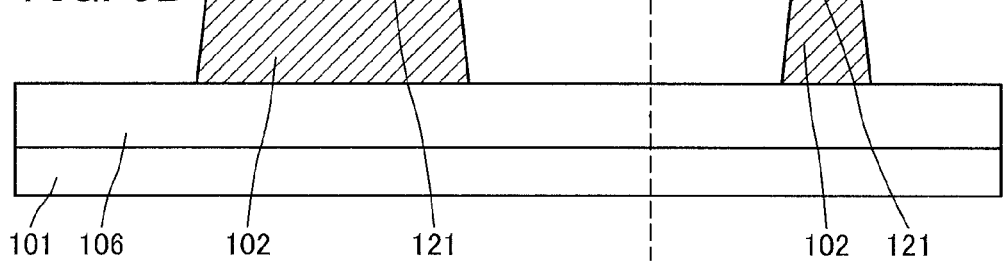

Next, the semiconductor film 112 is etched with the use of the hard mask 121 as a mask to form the island-shaped semiconductor layer 102 (FIG. 3D).

Dry etching is preferably used in etching the semiconductor film 112. At this time, the hard mask 121 is partly etched as illustrated in FIG. 3D, whereby end portions of the semiconductor layer 102 can be tapered.

It is preferable that the semiconductor film 112 be etched with the insulating layer 106 hardly being etched. Particularly in the case where the semiconductor film 112 is thick, formation of the projecting portion 110 of the insulating layer 106, which is described later, and the processing of the semiconductor layer 102 are preferably performed in different etching conditions because the thickness of the etched insulating layer 106 is difficult to control.

When an oxide semiconductor film is used as the semiconductor film 112 and the semiconductor film 112 is etched by dry etching, a hydrocarbon-based gas such as $CH_4$ can be used in the etching, for example. Furthermore, a rare gas may be contained as a dilution gas in such a gas.

[Formation of Projecting Portion]

Figure 3E:
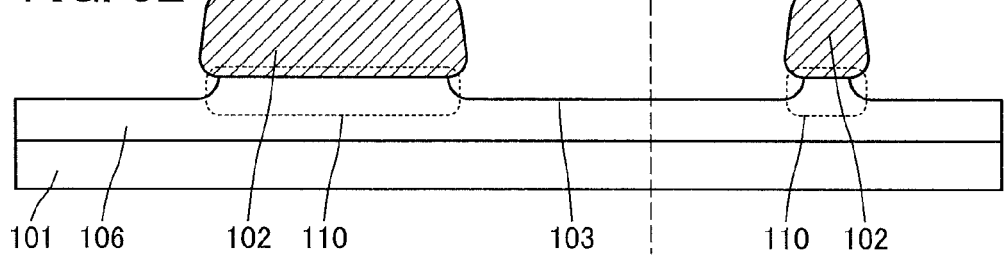

Next, the hard mask 121 is removed and part of the top surface of the insulating layer 106 is etched, whereby the projecting portion 110 is formed (FIG. 3E).

In etching the hard mask 121, part of the top surface of the insulating layer 106 is etched with the use of the hard mask 121 and the semiconductor layer 102 as masks. Thus, the top surface of the insulating layer 106 in a region overlapping with the semiconductor layer 102 is above the level of the top surface of the insulating layer 106 in a region other than the region, whereby the projecting portion 110 is formed under the semiconductor layer 102. In addition, under the semiconductor layer 102, the side surfaces of the projecting portion 110 are positioned on an inner side of the side surfaces of the semiconductor layer 102 by the etching. Thus, the insulating layer 106 can be processed so that the top surface of the projecting portion 110 is positioned on an inner side of an outline of the semiconductor layer 102 when seen from above.

Here, the etching condition is preferably set so that the semiconductor layer 102 is slightly etched. In such a condition, the top surface, the upper end portions, the lower end portions, and the like of the semiconductor layer 102 can be processed to have rounded corners as illustrated in FIG. 3E.

For example, a tungsten film is used as the hard mask 121 and a silicon oxynitride film is used as the insulating layer 106, and the tungsten film and the silicon oxynitride film are etched. In this case, a fluorocarbon-based gas such as $CF_4$, a chlorine-based gas such as $Cl_2$, a mixed gas containing any of these gases and oxygen, or the like can be used in the etching.

[Formation of Pair of Electrodes]

Next, a conductive film is formed over the insulating layer 106 and the semiconductor layer 102. A resist mask is formed over the conductive film by photolithography or the like, an unnecessary portion of the conductive film is removed by etching, and then the resist mask is removed. Thus, the pair of electrodes 103 can be formed (FIG. 4A).

The conductive film can be formed by a sputtering method, an evaporation method, a CVD method, or the like.

Here, it is preferable that the formation condition of the conductive film is set so that the side surfaces of the semiconductor layer 102 and the side surfaces of the projecting portion 110 of the insulating layer 106 are surely covered with the conductive film.

Figure 4A:
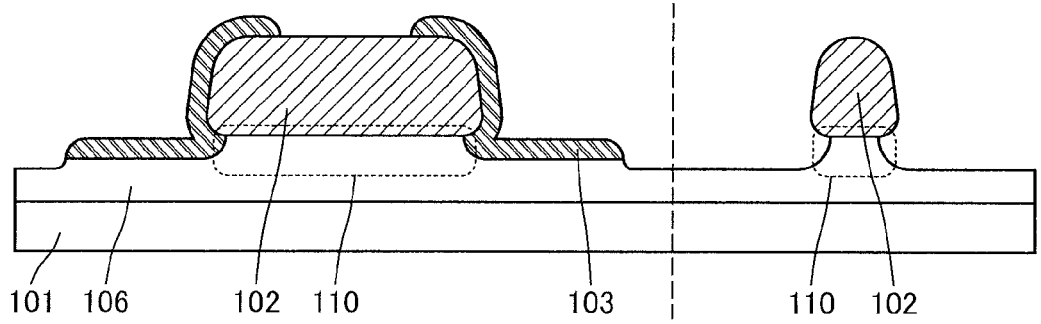
FIGS. 4A to 4C illustrate an example of the method for manufacturing the semiconductor device of the embodiment.

As illustrated in FIG. 4A, in a region which is not covered with the pair of electrodes 103, the top surface of the insulating layer 106 might be partly etched at the same time as the conductive film is etched. In that case, in a cross section in the channel width direction, the height of the projecting portion 110 is further increased. As described above, the top surface of the insulating layer 106 is etched two times, i.e., at the time of etching the hard mask 121 and at the time of forming the pair of electrodes 103; thus, the height of the projecting portion 110 can be further increased, and the gate electrode 105 can be easily provided below the bottom surface of the semiconductor layer 102 in the channel width direction in a later step.

A tungsten film is used as the conductive film, and the pair of electrodes 103 is formed by dry etching, for example. Here, a fluorocarbon-based gas such as $CF_4$, a chlorine-based gas such as $Cl_2$, a mixed gas containing any of these gases and oxygen, or the like can be used in the etching.

[Formation of Gate Insulating Layer and Gate Electrode]

Next, the insulating layer 104 is formed over the semiconductor layer 102, the pair of electrodes 103, and the insulating layer 106.

The insulating layer 104 can be formed by a sputtering method, a CVD method, an MBE method, an ALD method, a PLD method, or the like. In particular, it is preferable that the insulating film be formed by a CVD method, further preferably a plasma CVD method because the insulating layer 104 can adequately cover the semiconductor layer 102, the pair of electrodes 103, and the insulating layer 106.

Figure 4B:
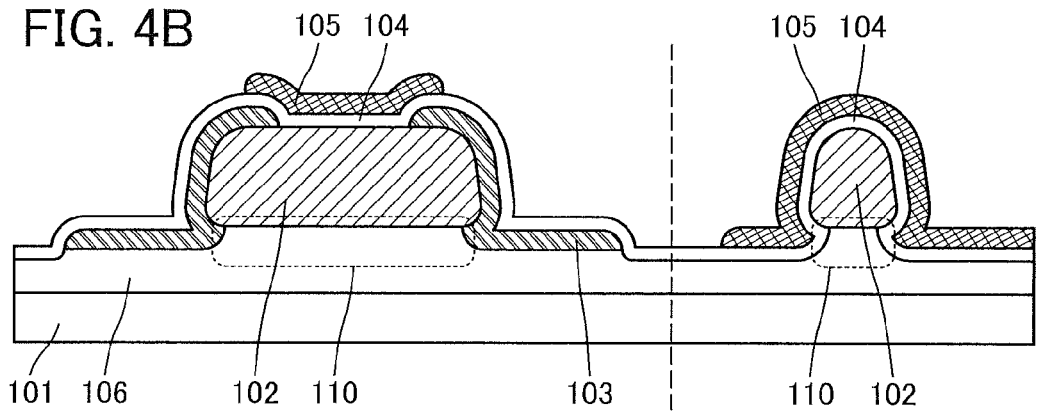
Figure 4C:
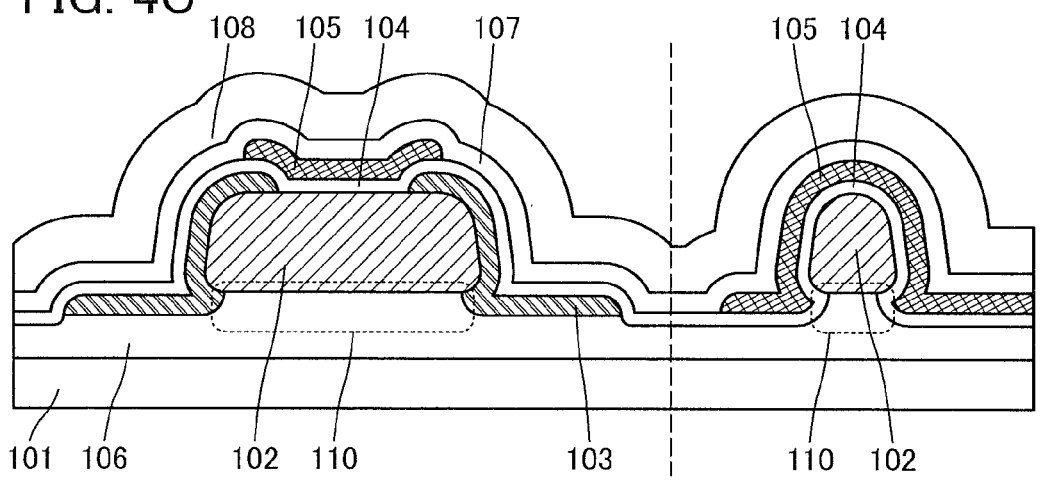

Next, a conductive film is formed over the insulating layer 104. A resist mask is formed over the conductive film by photolithography or the like, an unnecessary portion of the conductive film is removed by etching, and then the resist mask is removed. Thus, the gate electrode 105 can be formed (FIG. 4B).

The conductive film can be formed by a sputtering method, an evaporation method, or a CVD method, for example.

A tungsten film is used as the conductive film, and the gate electrode 105 is formed by dry etching, for example. Here, a fluorocarbon-based gas such as $CF_4$, a chlorine-based gas such as $Cl_2$, a mixed gas containing any of these gases and oxygen, or the like can be used in the etching. When a tantalum nitride film is used as the conductive film, a chlorine-based gas such as $BCl_3$ or $Cl_2$ can be used.

Here, the conductive film serving as the gate electrode 105 is preferably formed to adequately cover the semiconductor layer 102 so that the conductive film fills a space under the lower end portions of the semiconductor layer 102 in a cross section in the channel width direction.

[Formation of Insulating Layer]

Next, the insulating layer 107 is formed over the insulating layer 104 and the gate electrode 105. Then, the insulating layer 108 is formed over the insulating layer 107.

The insulating layer 107 and the insulating layer 108 can each be formed by a sputtering method, a CVD method, an MBE method, an ALD method, a PLD method, or the like. In particular, it is preferable that the insulating layer 107 be formed by a CVD method, more preferably a plasma CVD method because the insulating layer 107 can adequately cover the insulating layer 104 and the gate electrode 105.

Through the above steps, the transistor 100 can be manufactured.

[Heat Treatment]

After the formation of the insulating layer 108, heat treatment may be performed. Through the heat treatment, oxygen can be supplied from the insulating layer 106 (and the insulating layer 107) to the semiconductor layer 102 to reduce oxygen vacancies in the semiconductor layer 102. In addition, because the insulating layer 107 (or the insulating layer 108) is relatively impermeable to oxygen, oxygen is inhibited from being released from the insulating layer 106 (and the insulating layer 107) and the semiconductor layer 102 to the outside. Thus, formation of oxygen vacancies in the semiconductor layer 102 is inhibited and the amount of oxygen that is released from the insulating layer 106 (and the insulating layer 107) and to be supplied to the semiconductor layer 102 can be increased; consequently, oxygen vacancies in the semiconductor layer 102 can be effectively reduced.

The above is the description of the example of the manufacturing process of the transistor 100.

This embodiment can be implemented in combination with any of the other embodiments in this specification as appropriate.

(Embodiment 2)

In this embodiment, a structural example of a transistor with a structure partly different from that of the transistor described in Embodiment 1 is described. Note that description of the portions already described is omitted and only different portions are described in detail. Even when positions and shapes of components are different from those in Embodiment 1, the same reference numerals are used as long as the components have the same functions as those in Embodiment 1, and detailed description thereof is omitted in some cases.

A semiconductor device of one embodiment of the present invention preferably includes an oxide layer, which contains as its constituent element at least one of the metal elements contained in an oxide semiconductor layer, between the oxide semiconductor layer and an insulating layer overlapping with the oxide semiconductor layer. This suppresses the formation of a trap state at the interface between the oxide semiconductor layer and the insulating layer overlapping with the oxide semiconductor layer.

That is, one embodiment of the present invention preferably has a structure in which at least one of the top surface and the bottom surface of the oxide semiconductor layer, which are at least in a channel formation region, is in contact with the oxide layer serving as a barrier film for preventing generation of an interface state in the oxide semiconductor layer. Such a structure makes it possible to reduce the generation of oxygen vacancies producing carriers and the entry of impurities into the oxide semiconductor layer and at an interface. Thus, a highly purified intrinsic oxide semiconductor layer can be obtained. Obtaining a highly purified intrinsic oxide semiconductor layer refers to purifying or substantially purifying the oxide semiconductor layer to be an intrinsic or substantially intrinsic oxide semiconductor layer. It is thus possible to reduce a change in the electrical characteristics of a transistor including the oxide semiconductor layer and to provide a highly reliable semiconductor device.

Note that in this specification and the like, a substantially intrinsic oxide semiconductor layer has a carrier density lower than $1\times10^{17}/cm^3$, lower than $1\times10^{15}/cm^3$, or lower than $1\times10^{13}/cm^3$. With a highly purified intrinsic oxide semiconductor layer, the transistor can have stable electrical characteristics.

More specifically, the following structures can be employed for example.

STRUCTURAL EXAMPLE 1

Figure 5A:
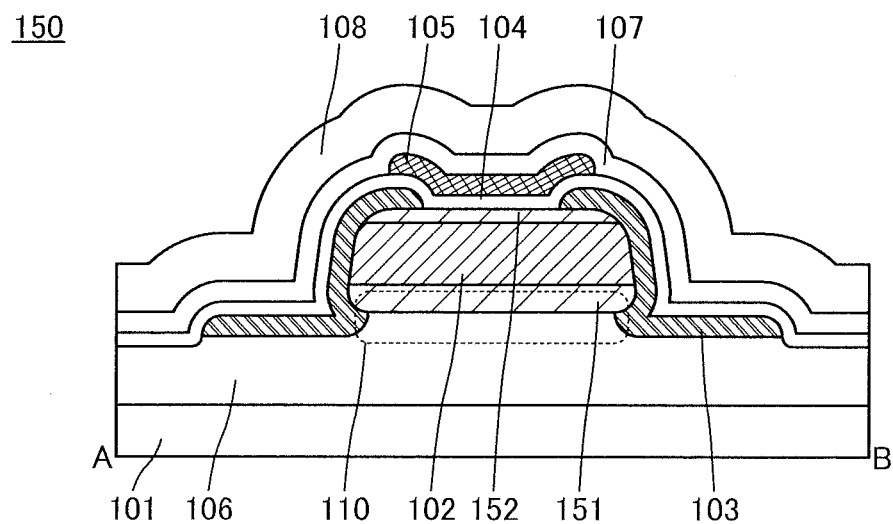
FIGS. 5A and 5B illustrate a structural example of a semiconductor device of an embodiment.
Figure 5B:
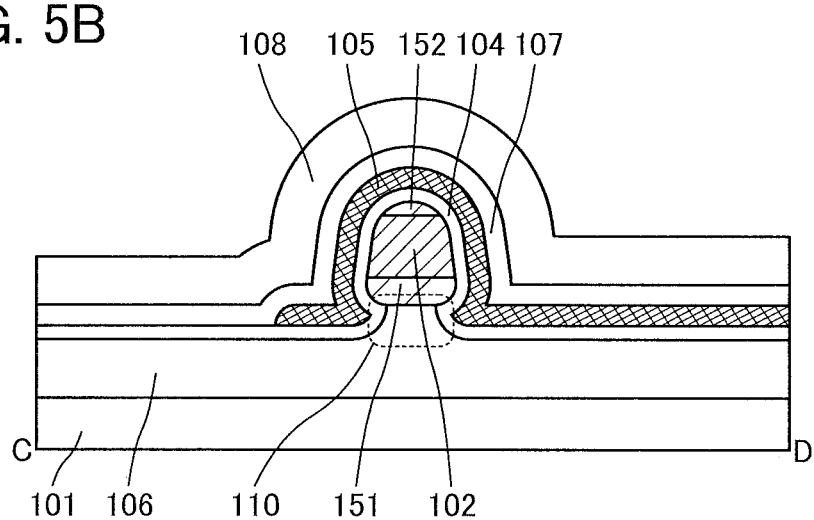

FIGS. 5A and 5B are schematic cross-sectional views of a transistor 150 described below as an example. Note that a schematic top view of the transistor 150 can be referred to FIG. 1A. The transistor 150 illustrated in FIGS. 5A and 5B differs from the transistor 100 described as an example in Embodiment 1 mainly in that a first oxide layer 151 and a second oxide layer 152 are included.

The first oxide layer 151 is provided between the insulating layer 106 and the semiconductor layer 102.

The second oxide layer 152 is provided between the semiconductor layer 102 and the insulating layer 104. Specifically, a top surface of the second oxide layer 152 is in contact with bottom surfaces of the pair of electrodes 103 and a bottom surface of the insulating layer 104.

The top surface of the projecting portion 110 of the insulating layer 106 is positioned on an inner side of an outline of at least one of the first oxide layer 151, the semiconductor layer 102, and the second oxide layer 152 when seen from above. In other words, the outline of the top surface of the projecting portion 110 of the insulating layer 106 is positioned on an inner side of the outline of any of the first oxide layer 151, the semiconductor layer 102, and the second oxide layer 152 when seen from above.

The projecting portion 110 is provided so that the top surface thereof is positioned on an inner side of an outline of the semiconductor layer 102 when seen from above. In other words, the projecting portion 110 is provided so that the outline of the top surface thereof is positioned on an inner side of the outline of the semiconductor layer 102 when seen from above.

With such a structure, an electric field can be applied from not only the top surface and the side surfaces of the semiconductor layer 102 but also part of a surface in a downward direction of the semiconductor layer 102 by the gate electrode 105. Consequently, the field-effect mobility of the transistor 150 can be improved.

The first oxide layer 151 and the second oxide layer 152 each contain an oxide containing one or more of the metal elements contained in the semiconductor layer 102.

Note that the boundary between the semiconductor layer 102 and the first oxide layer 151 or the boundary between the semiconductor layer 102 and the second oxide layer 152 is not clear in some cases.

For example, the first oxide layer 151 and the second oxide layer 152 each contain In or Ga; the first oxide layer 151 and the second oxide layer 152 each contain, for example, a material typified by an In—Ga-based oxide, an In—Zn-based oxide, gallium oxide, or an In—M—Zn-based oxide (M is Al, Ti, Ga, Y, Zr, La, Ce, Nd, or Hf). In addition, the conduction band minimum of the material is closer to a vacuum level than that of the semiconductor layer 102 is, and typically, the difference between the conduction band minimum of the first oxide layer 151 or the second oxide layer 152 and the conduction band minimum of the semiconductor layer 102 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower.

An oxide having a Ga (serving as a stabilizer) content higher than that of the semiconductor layer 102 is used for the first oxide layer 151 and the second oxide layer 152, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the first oxide layer 151 or the second oxide layer 152. Note that the above-described atomic ratios of the semiconductor layer 102, the first oxide layer 151, and the second oxide layer 152 each have an error of ±20%. For the first oxide layer 151 and the second oxide layer 152, materials with the same composition or material with different compositions may be used.

When an In—M—Zn-based oxide is used for the semiconductor layer 102, an oxide containing metal elements in the atomic ratio satisfying the following conditions is preferably used for a target for forming the semiconductor film serving as the semiconductor layer 102. Given that the atomic ratio of the metal elements in the oxide is In:M:Zn=$x_1$:$y_1$:$z_1$, it is preferable that $x_1/y_1$ be greater than or equal to ⅓ and less than or equal to 6, more preferably greater than or equal to 1 and less than or equal to 6, and $z_1/y_1$ be greater than or equal to ⅓ and less than or equal to 6, more preferably greater than or equal to 1 and less than or equal to 6. Typical examples of the atomic ratio of the metal elements in the target are In:M:Zn=1:1:1, In:M:Zn=3:1:2, and the like.

When an In—M—Zn-based oxide is used for the first oxide layer 151 and the second oxide layer 152, an oxide containing metal elements in the atomic ratio satisfying the following conditions is preferably used for a target for forming oxide films serving as the first oxide layer 151 and the second oxide layer 152. Given that the atomic ratio of metal elements in the oxide is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, more preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, and the like.

A material in which the conduction band minimum is closer to the vacuum level than that of the semiconductor layer 102 is used for the first oxide layer 151 and the second oxide layer 152, in which case a channel is mainly formed in the semiconductor layer 102 and therefore the semiconductor layer 102 serves as a main current path. When the semiconductor layer 102 in which the channel is formed is sandwiched between the first oxide layer 151 and the second oxide layer 152 as described above, generation of an interface state between these layers is suppressed, and thus reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of the transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the first oxide layer 151, and the second oxide layer 152 be set to appropriate values.

Here, the semiconductor layer 102 is preferably thicker than the first oxide layer 151. The thicker the semiconductor layer 102 is, the higher the on-state current of the transistor is. The thickness of the first oxide layer 151 may be set as appropriate as long as generation of an interface state at an interface with the semiconductor layer 102 is inhibited. For example, the thickness of the semiconductor layer 102 is larger than that of the first oxide layer 151, preferably 2 times or more. Note that the above does not apply in the case where the on-state current of the transistor does not need to be increased, in which case the thickness of the first oxide layer 151 may be larger than or equal to the semiconductor layer 102.

The thickness of the second oxide layer 152 may be set as appropriate, in a manner similar to that of the first oxide layer 151, as long as generation of an interface state at an interface with the semiconductor layer 102 is inhibited. For example, the thickness of the second oxide layer 152 may be smaller than or equal to that of the first oxide layer 151. The second oxide layer 152 preferably has a small thickness because the thick second oxide layer 152 might make it difficult for an electric field generated by the gate electrode 105 to extend to the semiconductor layer 102. For example, the second oxide layer 152 may be thinner than the semiconductor layer 102. Note that the thickness of the second oxide layer 152 is not limited to the above, and may be set as appropriate depending on a driving voltage of the transistor 150 in consideration of the withstanding voltage of the insulating layer 104.

Here, for example, when the semiconductor layer 102 is in contact with an insulating layer containing a different constituent element (e.g., an insulating layer including a silicon oxide film), an interface state is sometimes formed at the interface between the two layers and the interface state forms a channel. In this case, a second transistor having a different threshold voltage appears, so that an apparent threshold voltage of the transistor changes. However, the transistor 150 includes the first oxide layer 151 containing one or more of the metal elements contained in the semiconductor layer 102; therefore, variations and a change in the electrical characteristics of the transistor, such as threshold voltage, can be reduced.

When a channel is formed at the interface between the insulating layer 104 and the semiconductor layer 102, interface scattering occurs at the interface and the field-effect mobility of the transistor is reduced. However, the transistor 150 includes the second oxide layer 152 containing one or more of the metal elements contained in the semiconductor layer 102; therefore, scattering of carriers is less likely to occur at the interface between the second oxide layer 152 and the semiconductor layer 102, resulting in an increase in the field-effect mobility of the transistor.

Oxygen is easily diffused between the semiconductor layer 102 and the first oxide layer 151 and between the semiconductor layer 102 and the second oxide layer 152 because the semiconductor layer 102, the first oxide layer 151, and the second oxide layer 152 have similar compositions. Thus, a layer that can be called a mixed layer might be formed at a boundary between the semiconductor layer 102 and the first oxide layer 151 and a boundary between the semiconductor layer 102 and the second oxide layer 152. With the mixed layer, a junction is formed, in which the conduction band minimum of the semiconductor layer and the conduction band minimum of the oxide layer are continuous without a barrier provided therebetween (also referred to as a continuous junction). When impurities that form a defect state such as a trap center or a recombination center are mixed at interfaces between the layers, the continuity of the energy band is lost, and thus carriers are trapped or disappear by recombination at the interface in some cases. Formation of the continuous junction can inhibit a defect state from being formed at the interfaces between the layers; therefore, the electrical characteristics can be increased and the reliability of the transistor can be improved.

In addition, the transistor 150 includes the first oxide layer 151 between the semiconductor layer 102 and the insulating layer 106; thus, the level of the semiconductor layer 102 is high because of the thickness of the first oxide layer 151. That is, the level of part of the gate electrode 105 positioned below the semiconductor layer 102 is low, as compared to the case where the first oxide layer 151 is not provided. This makes it easy for an electric field from the gate electrode 105 to be applied to the bottom surface side of the semiconductor layer 102 in addition to the lower end portions of the semiconductor layer 102. Consequently, the field-effect mobility and the on-state current of the transistor can be increased.

Note that in the case where the first oxide layer 151 is thick or the case where the taper angle of the side surfaces of a stack including the first oxide layer 151, the semiconductor layer 102, and the second oxide layer 152 is large, the semiconductor layer 102 might be positioned on an inner side of the projecting portion 110 when seen from above. In such a case, at least the bottom surface of the gate electrode 105 needs to be positioned below the bottom surface of the first oxide layer 151, and at least the top surface of the projecting portion 110 needs to be positioned on an inner side of the first oxide layer 151 when seen from above. With such a structure, an electric field from the gate electrode 105 is applied to the bottom surface side of the semiconductor layer 102 in addition to the lower end portions of the semiconductor layer 102; thus, the field-effect mobility and the on-state current of the transistor can be increased.

MANUFACTURING METHOD EXAMPLE 1

The transistor 150 can be manufactured by a method partly different from the method for manufacturing the transistor 100 described in Embodiment 1.

Specifically, instead of forming the semiconductor film 112, a first oxide film serving as the first oxide layer 151, the semiconductor film 112, and a second oxide film serving as the second oxide layer 152 are formed in this order. Then, the first oxide film, the semiconductor film 112, and the second oxide film are processed to have island shapes with the use of the hard mask 121. Thus, the first oxide layer 151, the semiconductor layer 102, and the second oxide layer 152 can be formed.

The first oxide film and the second oxide film can be formed by a method similar to that of the semiconductor film 112.

It is particularly preferable that the first oxide film, the semiconductor film, and the second oxide film be formed successively without being exposed to the air. Successive formation of the films can reduce generation of an interface state at the interface between the films.

Steps other than the above steps can be referred to for the above-described manufacturing method example. The transistor 150 illustrated in FIGS. 5A and 5B can be manufactured by such a method.

The above is the description of Structural Example 1.

STRUCTURAL EXAMPLE 2

Figure 6A:
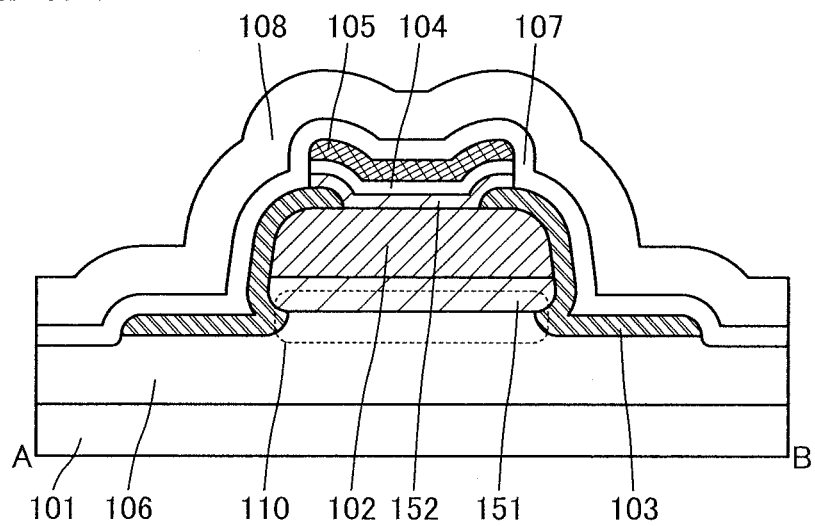
FIGS. 6A and 6B illustrate a structural example of a semiconductor device of an embodiment.
Figure 6B:
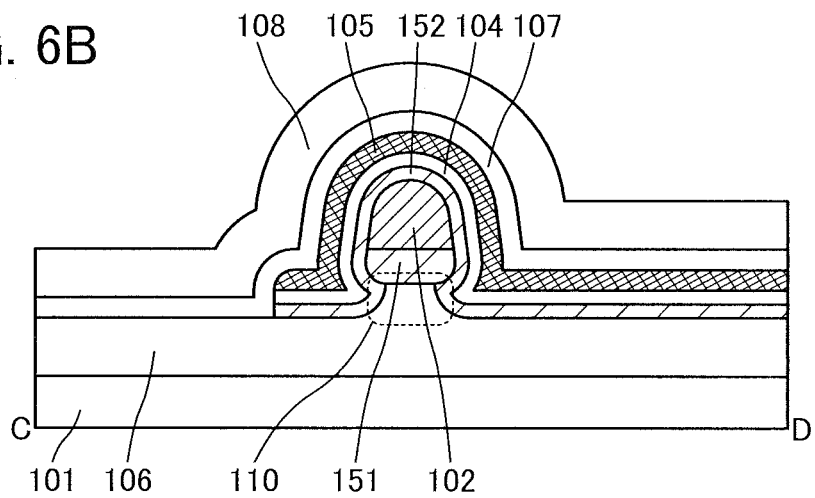

FIGS. 6A and 6B are schematic cross-sectional views of a transistor 160 described below as an example. Note that a schematic top view of the transistor 160 can be referred to FIG. 1A. Main differences between the transistor 160 illustrated in FIGS. 6A and 6B and the above-described transistor 150 lie in the shapes of the insulating layer 104 and the second oxide layer 152.

In the transistor 160, a bottom surface of the second oxide layer 152 is in contact with the top surfaces of the pair of electrodes 103. Furthermore, the second oxide layer 152 is in contact with the top surface and the side surfaces of the semiconductor layer 102 and the side surfaces of the first oxide layer 151 in a region where the pair of electrodes 103 is not provided.

The top surface of the projecting portion 110 is preferably positioned on an inner side of at least the outline of the second oxide layer 152. It is more preferable that the top surface of the projecting portion 110 is positioned on an inner side of the outline of the first oxide layer 151 or the outline of the semiconductor layer 102.

With such a structure, an electric field can be applied from not only the top surface and the side surfaces of the semiconductor layer 102 but also part of a surface in a downward direction of the semiconductor layer 102 by the gate electrode 105. Consequently, the field-effect mobility of the transistor 160 can be improved.

In the structure illustrated in FIGS. 6A and 6B, the second oxide layer 152, the insulating layer 104, and the gate electrode 105 are processed with the use of one photomask so that the shapes of the second oxide layer 152, the insulating layer 104, and the gate electrode 105 are aligned with one another when seen from above.

As illustrated in FIG. 6B, in a channel formation region of the transistor 160, not only the top surface of the semiconductor layer 102 but also the side surfaces thereof are in contact with the second oxide layer 152. That is, the channel formation region in the semiconductor layer 102 is surrounded by the first oxide layer 151 and the second oxide layer 152. Accordingly, the side surfaces of the semiconductor layer 102 are not in contact with the insulating layer 104, which makes it possible to eliminate influence of an interface state which might be generated at the boundary between the semiconductor layer 102 and the insulating layer 104; thus, a change in the electrical characteristics of the transistor can be suppressed more effectively.

In addition, the transistor 160 includes the first oxide layer 151 between the semiconductor layer 102 and the insulating layer 106; thus, the level of the semiconductor layer 102 is high because of the thickness of the first oxide layer 151. That is, the level of part of the gate electrode 105 positioned below the semiconductor layer 102 is low, as compared to the case where the first oxide layer 151 is not provided. This makes it easy for an electric field from the gate electrode 105 to be applied to the bottom surface side of the semiconductor layer 102 in addition to the lower end portions of the semiconductor layer 102. Consequently, the field-effect mobility and the on-state current of the transistor can be increased.

Note that in the case where the first oxide layer 151 is thick, the case where the second oxide layer 152 is thick, or the case where the taper angle of the side surfaces of a stack including the first oxide layer 151 and the semiconductor layer 102 is large, the semiconductor layer 102 might be positioned on an inner side of the projecting portion 110 when seen from above. In such a case, at least the bottom surface of the gate electrode 105 needs to be positioned below the bottom surface of the first oxide layer 151, and at least the top surface of the projecting portion 110 needs to be positioned on an inner side of the width of the second oxide layer 152 positioned above the top surface of the projecting portion 110 when seen from above. With such a structure, an electric field from the gate electrode 105 is applied to the bottom surface side of the semiconductor layer 102 in addition to the lower end portions of the semiconductor layer 102; thus, the field-effect mobility and the on-state current of the transistor can be increased.

MANUFACTURING METHOD EXAMPLE 2

The transistor 160 can be manufactured by a method in which the manufacturing method of the transistor 100 described in Embodiment 1 or Manufacturing Method Example 1 is partly changed.

Specifically, instead of forming the semiconductor film 112 as the semiconductor layer 102, a first oxide film and the semiconductor film 112 are formed in this order. The first oxide film and the semiconductor film 112 are processed to have an island shape with the use of the hard mask 121, whereby the first oxide layer 151 and the semiconductor layer 102 are formed. Then, the pair of electrodes 103 is formed in a manner similar to the above.

Prior to the formation process of the insulating layer 104 and the gate electrode 105, a second oxide film is formed\. The conductive film, the insulating layer 104, and the second oxide film are processed with the use of one photomask, whereby the gate electrode 105, the insulating layer 104, the second oxide layer 152 are formed.

The above manufacturing method example can be referred to for the subsequent steps. In this manner, the transistor 160 illustrated in FIGS. 6A and 6B can be manufactured.

The above is the description of Structural Example 2.

This embodiment can be combined as appropriate with any of the other embodiments or an example in this specification.

(Embodiment 3)

An oxide semiconductor that can be favorably used for a semiconductor layer and an oxide layer of a semiconductor device of one embodiment of the present invention is described in this embodiment.

An oxide semiconductor has a wide energy gap of 3.0 eV or more. A transistor using an oxide semiconductor film obtained by processing an oxide semiconductor in an appropriate condition while sufficiently reducing the carrier density can have much lower leakage current between a source and a drain in an off state (off-state current) than a conventional transistor using silicon.

In the case where an oxide semiconductor film is used for a transistor, the thickness of the oxide semiconductor film is preferably greater than or equal to 2 nm and less than or equal to 40 nm.

An oxide semiconductor that can be used for a transistor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In to Ga and Zn. The In—Ga—Z-based oxide may contain another metal element in addition to In, Ga, and Zn.

Alternatively, a material represented by $InMO_3(ZnO)_m$ (m>0 is satisfied, and in is not an integer) may be used as an oxide semiconductor. Note that M represents one or more metal elements selected from Ga, Fe, Mn, and Co, or the above-described element as a stabilizer. Further alternatively, as the oxide semiconductor, a material represented by $In_2SnO_5(ZnO)_n$ (n>0, and n is a natural number) may be used.

For example, an In—Ga—Zn-based oxide in which an atomic ratio of In to Ga and Zn is 1:1:1, 1:3:2, 1:3:4, 1:3:6, 3:1:2, or 2:1:3, or an oxide whose composition is in the neighborhood of the above compositions may be used.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor using an oxide semiconductor film is in an off-state can be less than or equal to $1\times10^{-18}$ A, preferably less than or equal to $1\times10^{-21}$ A, more preferably less than or equal to $1\times10^{-24}$ A at room temperature (about 25° C.); or less than or equal to $1\times10^{-15}$ A, preferably less than or equal to $1\times10^{-18}$ A, more preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of the oxide semiconductor film is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts is seen. However, a boundary between crystal parts, that is, a grain boundary is not clearly observed even in the high-resolution TEM image. Thus, in the CAAC-OS film, a reduction in electron mobility due to the grain boundary is less likely to occur.

In a high-resolution cross-sectional TEM image of the CAAC-OS film observed in a direction substantially parallel to a sample surface, metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In a high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film including an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of bonding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has negative threshold voltage (is rarely normally on). The highly purified intrinsic or substantially highly purified intrinsic oxide semiconductor film has few carrier traps. Accordingly, the transistor using the oxide semiconductor film has little change in electrical characteristics and high reliability. Electric charge trapped by the carrier traps in the oxide semiconductor film takes a long time to be released, and might behave like fixed electric charge. Thus, the transistor that uses the oxide semiconductor film having high impurity concentration and a high density of defect states has unstable electrical characteristics in some cases.

With the use of the CAAC-OS film in a transistor, a change in the electrical characteristics of the transistor due to irradiation with visible light or ultraviolet light is small.

Next, a microcrystalline oxide semiconductor film is described.

A microcrystalline oxide semiconductor film has a region where a crystal part can be found in the high-resolution TEM image and a region where a crystal part cannot be found clearly in the high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In the high-resolution TEM image of the nc-OS film, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are observed in a nanobeam electron diffraction pattern of the nc-OS film that is obtained by using an electron beam having a probe diameter close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots is shown in a ring-like region in some cases. Also in a nanobeam electron diffraction pattern of the nc-OS film, a plurality of spots is shown in a ring-like region in some cases.

The nc-OS film is an oxide semiconductor film having more regularity than an amorphous oxide semiconductor film; thus, the nc-OS film has a lower density of defect levels than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked-layer film including two or more films of an amorphous oxide semiconductor film, a microcrystalline oxide semiconductor film, and a CAAC-OS film, for example.

This embodiment can be combined as appropriate with any of the other embodiments or an example in this specification.

(Embodiment 4)

In this embodiment, an example of a semiconductor device (memory device) which includes the transistor of one embodiment of the present invention, which can hold stored data even when not powered, and which has an unlimited number of write cycles is described with reference to drawings. The transistor includes an oxide semiconductor.

Figure 7:
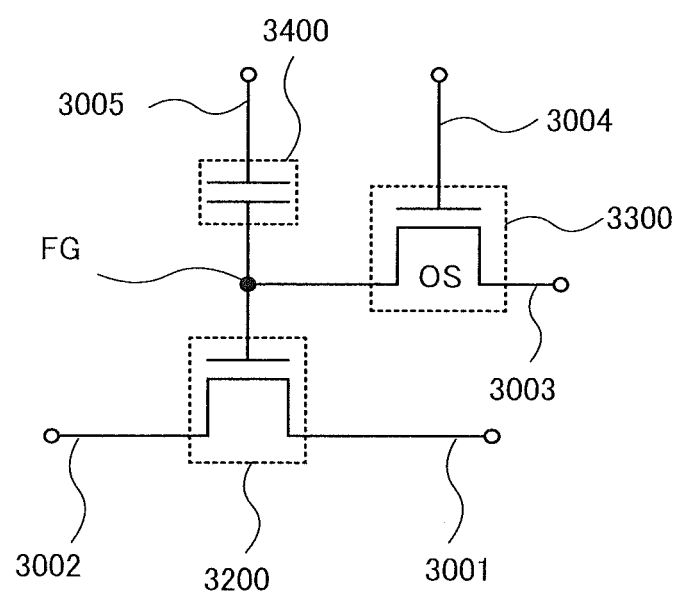
FIG. 7 is a circuit diagram of a semiconductor device of an embodiment.

FIG. 7 is a circuit diagram of a semiconductor device.

The semiconductor device illustrated in FIG. 7 includes a transistor 3200 using a first semiconductor material, a transistor 3300 using a second semiconductor material, and a capacitor 3400. As the transistor 3300, the transistor described in the above embodiments can be used.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in the above embodiment can be used as the second semiconductor material. A transistor using a material other than an oxide semiconductor, such as single crystal silicon, can operate at high speed easily. A transistor using an oxide semiconductor has low off-state current.

The transistor 3300 is a transistor in which a channel is formed in a semiconductor layer including an oxide semiconductor. Since the off-state current of the transistor 3300 is low, stored data can be held for a long period owing to such a transistor. In other words, power consumption can be sufficiently reduced because a semiconductor device in which refresh operation is unnecessary or the frequency of refresh operation is extremely low can be provided.

In FIG. 7, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 7 utilizes a characteristic in which the potential of the gate electrode of the transistor 3200 can be held, and thus enables writing, holding, and reading of data as follows.

Writing and holding of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined electric charge is supplied to the gate electrode of the transistor 3200 (writing). Here, electric charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the electric charge given to the gate electrode of the transistor 3200 is held (holding).

Since the off-state current of the transistor 3300 is extremely small, the electric charge of the gate electrode of the transistor 3200 is held for a long time.

Next, reading of data is described. By supplying an appropriate potential (a reading potential) to the fifth wiring 3005 while supplying a predetermined potential (a constant potential) to the first wiring 3001, the potential of the second wiring 3002 varies depending on the amount of electric charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, by setting the potential of the fifth wiring 3005 to a potential $V_0$ which is between $V_{th\_H}$ and $V_{th\_L}$, electric charge given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

When a transistor having a channel formation region formed using an oxide semiconductor and having extremely small off-state current is used for the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. In other words, the semiconductor device of one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

Note that this embodiment can be combined as appropriate with any of the other embodiments or an example in this specification.

(Embodiment 5)

In this embodiment, a CPU that includes the transistor described in any of the above embodiments or the memory device described in the above embodiment is described.

Figure 8:
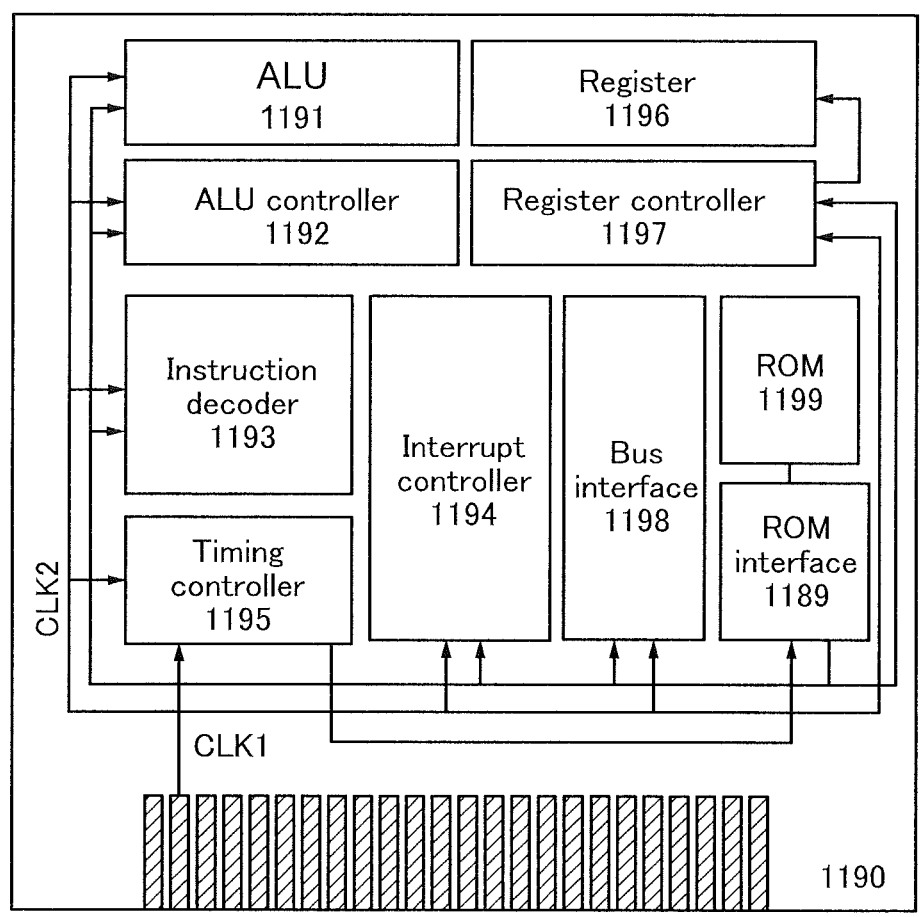
FIG. 8 is a block diagram of a semiconductor device of an embodiment.

FIG. 8 is a block diagram illustrating an example of the configuration of a CPU at least part of which includes the transistor described in any of the above embodiments.

The CPU illustrated in FIG. 8 includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 8 is just an example in which the configuration has been simplified, and an actual CPU may have various configurations depending on the use. For example, the CPU may have a configuration including a plurality of cores that operate in parallel; each of the cores has a structure including the CPU or the arithmetic circuit illustrated in FIG. 8. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 8, a memory cell is provided in the register 1196. For the memory cell of the register 1196, any of the transistors described in the above embodiments can be used.

In the CPU illustrated in FIG. 8, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, power supply voltage is supplied to the memory cell in the register 1196. When data holding by the capacitor is selected, the data is rewritten in the capacitor, and supply of power supply voltage to the memory cell in the register 1196 can be stopped.

Figure 9:
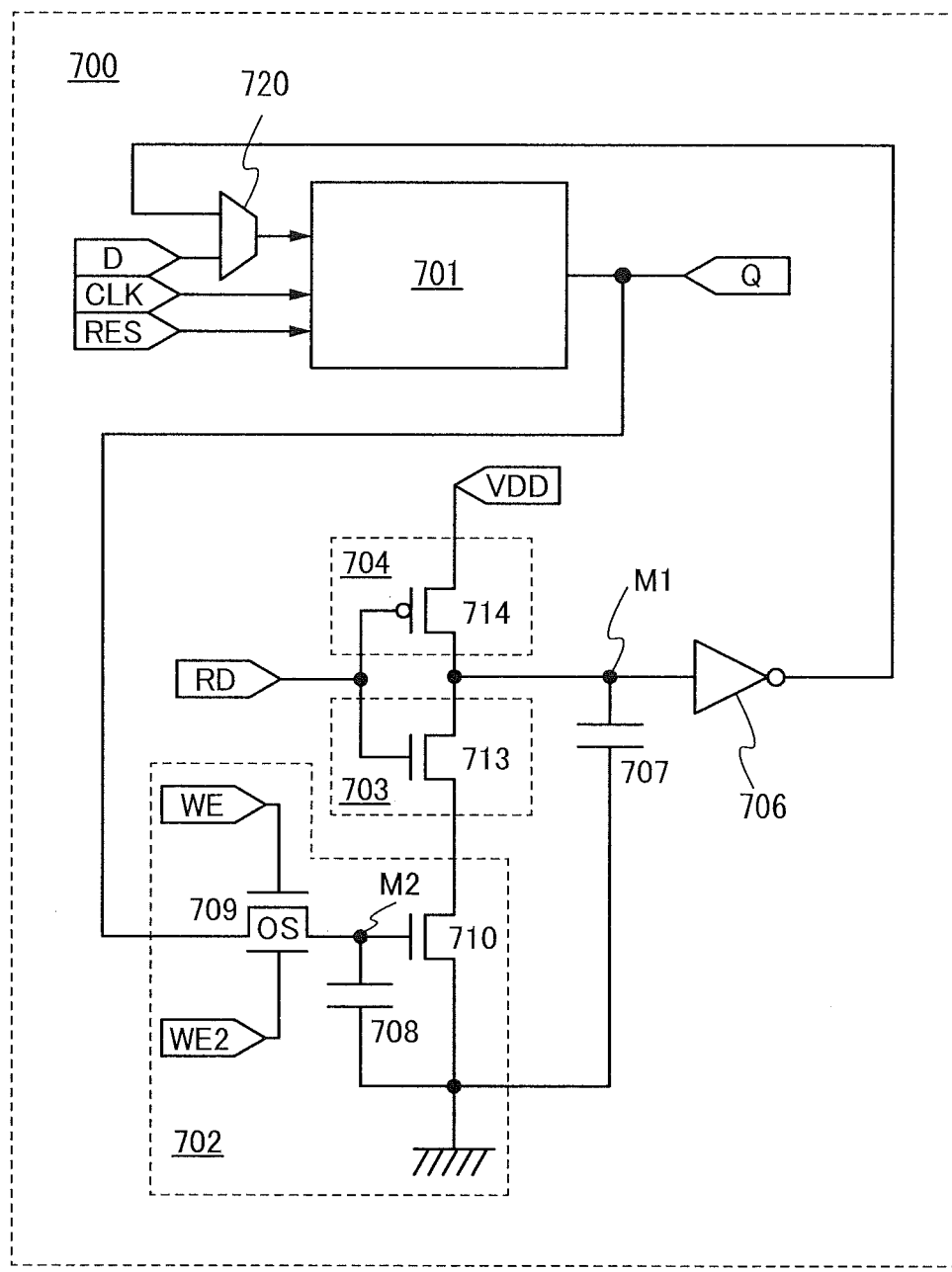
FIG. 9 is a circuit diagram of a memory device of an embodiment.

FIG. 9 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the above embodiment can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to a first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 9 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 9, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 9, the transistor described in any of the above embodiments can be used. The transistor 709 preferably includes a second gate (second gate electrode). The control signal WE can be input to the first gate and the control signal WE2 can be input to the second gate. The control signal WE2 may be a signal having a constant potential. As the constant potential, for example, a ground potential GND or a potential lower than a source potential of the transistor 709 is selected. The control signal WE2 is a potential signal for controlling the threshold voltage of the transistor 709, and the cut-off current (Icut) of the transistor 709 can be further reduced. As the transistor 709, the transistor without the second gate can be used.

Furthermore, in FIG. 9, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 9, for example, a flip-flop circuit can be used. As the logic element 706, for example, an inverter, a clocked inverter, or the like can be used.

In the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when such a transistor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By using the above-described memory element 700 in a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be reduced.

Although an example in which the memory element 700 is used in a CPU is described in this embodiment, the memory element 700 can also be used in a digital signal processor (DSP), a custom LSI, an LSI such as a programmable logic device (PLD), and a radio frequency identification (RF-ID).

This embodiment can be combined as appropriate with any of the other embodiments or an example in this specification.

(Embodiment 6)

In this embodiment, description is given of examples of an electronic device which can use any of the semiconductor devices described in the above embodiments, such as the transistors, the memory device, and the CPU (including a DSP, a custom LSI, a PLD, and an RF-ID).

Any of the transistors, the memory device, and the CPU described in the above embodiments can be used in a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Further, the examples include industrial equipment such as guide lights, traffic lights, belt conveyors, elevators, escalators, industrial robots, and power storage systems. In addition, moving objects and the like driven by fuel engines and electric motors using electric power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PREV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Some specific examples of these electronic devices are illustrated in FIGS. 10A to 10C.

Figure 10A:
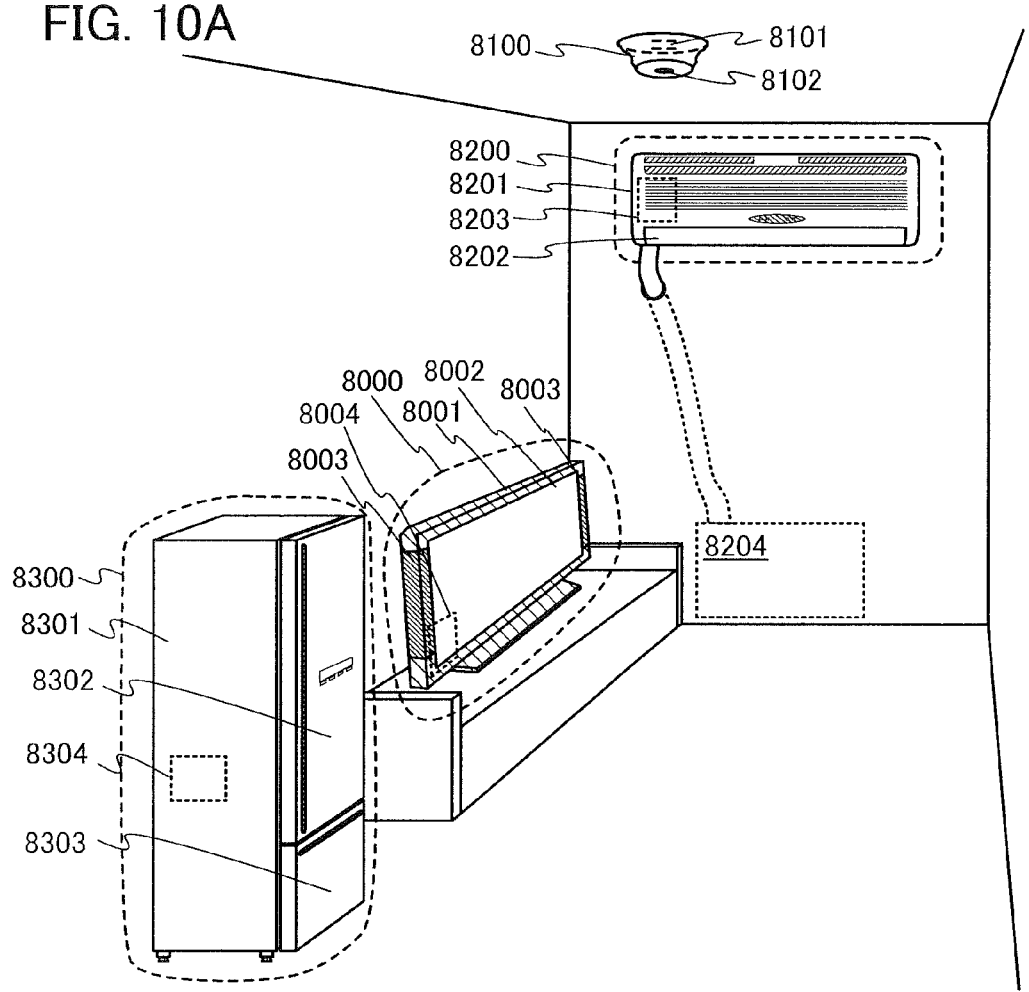
FIGS. 10A to 10C illustrate electronic devices of embodiments.
Figure 10B:
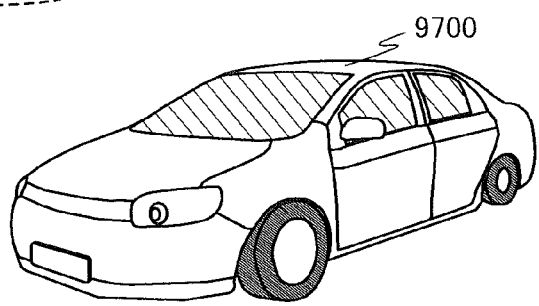
Figure 10C:
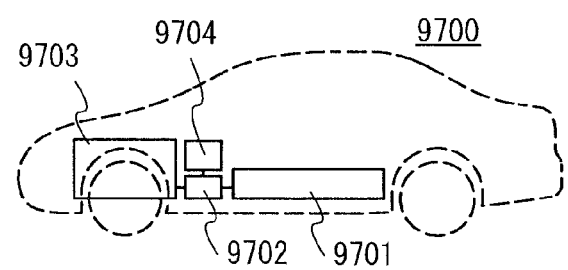

In a television set 8000 illustrated in FIG. 10A, a display portion 8002 is incorporated in a housing 8001. The display portion 8002 can display an image and a speaker portion 8003 can output sound. Any of the transistors described in the above embodiments can be used in a pixel or a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, the television set 8000 can receive a general television broadcast. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. The transistor, the memory device, or the CPU described in any of the above embodiments is used for the CPU 8004 or the memory, whereby power consumption can be reduced.

An alarm device 8100 illustrated in FIG. 10A is a residential fire alarm, and includes a sensor portion 8102 for smoke or heat and a microcomputer 8101. The microcomputer 8101 is an example of an electronic device including the transistor, the memory device, or the CPU described in any of the above embodiments.

An air conditioner which includes an indoor unit 8200 and an outdoor unit 8204 illustrated in FIG. 10A is an example of an electronic device including the transistor, the memory device, the CPU, or the like described in any of the above embodiments. Specifically, the indoor unit 8200 includes a housing 8201, an air outlet 8202, a CPU 8203, and the like. Although FIG. 10A shows the case where the CPU 8203 is provided in the indoor unit 8200, the CPU 8203 may be provided in the outdoor unit 8204. Alternatively, the CPU 8203 may be provided in each of the indoor unit 8200 and the outdoor unit 8204. When any of the transistors described in the above embodiments is used for the CPU in the air conditioner, power consumption of the air conditioner can be reduced.

An electric refrigerator-freezer 8300 illustrated in FIG. 10A is an example of an electronic device including the transistor, the memory device, the CPU, or the like described in any of the above embodiments. Specifically, the electric refrigerator-freezer 8300 includes a housing 8301, a refrigerator door 8302, a freezer door 8303, a CPU 8304, and the like. The CPU 8304 is provided in the housing 8301 in FIG. 10A. When any of the transistors described in the above embodiments is used for the CPU 8304 of the electric refrigerator-freezer 8300, power consumption of the electric refrigerator-freezer 8300 can be reduced.

FIGS. 10B and 10C illustrate an example of an electric vehicle as an example of the electronic devices. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When any of the transistors described in the above embodiments is used for the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the circuit 9702 based on input data such as data on operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter, which converts direct current into alternate current, is also incorporated.

This embodiment can be combined as appropriate with any of the other embodiments or an example in this specification.

EXAMPLE

In this example, a transistor was formed and a cross-sectional image of the transistor was observed. Here, the transistor had the structure described in Structural Example 2 of Embodiment 2 (FIGS. 6A and 6B).

[Formation of Sample]

A silicon wafer was used as a substrate of the sample. First, the substrate was subjected to thermal oxidation, so that a thermal oxidation film was formed over the substrate surface. Next, an approximately 300-nm-thick silicon oxynitride film was formed over the thermal oxidation film by a plasma CVD method, then a surface of the silicon oxynitride film was planarized by chemical mechanical polishing (CMP).

Next, an approximately 20-nm-thick oxide semiconductor film OS1 and an approximately 40-nm-thick oxide semiconductor film OS2 having a different composition from OS1 were deposited in this order by a sputtering method.

Next, an approximately 10-nm-thick tungsten film was deposited by a sputtering method. An approximately 20-nm-thick non-photosensitive organic resin film and an approximately 100-nm-thick negative resist film were formed over the tungsten film. Exposure was performed on the resist film by scanning of an electron beam and development was performed, whereby the resist film was patterned. Then, the organic resin film and the tungsten film were etched by dry etching with the use of the resist film as a mask; thus, an island-shaped hard mask of the tungsten film was formed over the oxide semiconductor film OS2.

The etching was first performed in the following conditions: the etching gas was $CF_4$ (with a flow rate of 100 sccm), the ICP power was 2000 W, the bias power was 50 W, the pressure was 0.67 Pa, and the substrate temperature was −10° C. Then, another etching was performed in the following conditions: the etching gas was a mixed gas of $CF_4$ (with a flow rate of 60 sccm) and $O_2$ (with a flow rate of 40 sccm), the ICP power was 1000 W, the bias power was 25 W, the pressure was 2.0 Pa, and the substrate temperature was −10° C.

Next, the resist film and the organic resin film were removed by plasma treatment (also referred to as aching) in an oxygen atmosphere.

Next, the oxide semiconductor film OS1 and the oxide semiconductor film OS2 were etched to form an island-shaped oxide semiconductor film OS1 (a first oxide layer) and an island-shaped oxide semiconductor film OS2 (a semiconductor layer). The etching conditions were as follows: the etching gas was a mixed gas of $CH_4$ (with a flow rate of 16 sccm) and Ar (with a flow rate of 32 sccm), the ICP power was 600 W, the bias power was 100 W, the pressure was 1.0 Pa, and the substrate temperature was 70° C.

Then, the hard mask was etched and a projecting portion of an insulating layer was formed. The etching conditions were as follows: the etching gas was a mixed gas of $CF_4$ (with a flow rate of 60 sccm) and $O_2$ (with a flow rate of 40 sccm), the ICP power was 1000 W, the bias power was 25 W, the pressure was 2.0 Pa, and the substrate temperature was −10° C.

Next, an approximately 10-nm-thick tungsten film was deposited by a sputtering method, and an approximately 20-nm-thick non-photosensitive organic resin film was formed over the tungsten film. A resist film was patterned over the tungsten film by a method similar to that described above.

Next, the tungsten film and the organic resin film were etched with the use of the resist film as a mask. The etching was first performed in the following conditions: the etching gas was $CF_4$ (with a flow rate of 100 sccm), the ICP power was 2000 W, the bias power was 50 W, the pressure was 0.67 Pa, and the substrate temperature was −10° C. Then, another etching was performed in the following conditions: the etching gas was a mixed gas of $CF_4$ (with a flow rate of 60 sccm) and $O_2$ (with a flow rate of 40 sccm), the ICP power was 1000 W, the bias power was 25 W, the pressure was 2.0 Pa, and the substrate temperature was −10° C.

Then, the resist mask and the organic resin film were removed by ashing. Thus, a pair of electrodes was formed.

Next, an approximately 5-nm-thick oxide semiconductor film OS3 was formed by a sputtering method. An approximately 10-nm-thick silicon oxynitride film was formed by a plasma CVD method. An approximately 10-nm-thick titanium nitride film and an approximately 10-nm-thick tungsten film were successively formed by a sputtering method. Then, a resist film was patterned over the tungsten film by a method similar to that described above.

Next, the tungsten film and the titanium nitride film were etched with the use of the resist film as a mask. The etching was first performed in the following conditions: the etching gas was a mixed gas of $Cl_2$ (with a flow rate of 45 sccm), $CF_4$ (with a flow rate of 55 sccm), and $O_2$ (with a flow rate of 55 sccm), the ICP power was 3000 W, the bias power was 110 W, the pressure was 0.67 Pa, and the substrate temperature was 40° C. Then, another etching was performed in the following conditions: the etching gas was a mixed gas of $Cl_2$ (with a flow rate of 50 sccm) and $BCl_3$ (with a flow rate of 150 sccm), the ICP power was 1000 W, the bias power was 50 W, the pressure was 0.67 Pa, and the substrate temperature was 40° C.

Next, the silicon oxynitride film was etched. The etching conditions were as follows: the etching gas was a mixed gas of $CHF_3$ (with a flow rate of 56 sccm) and He (with a flow rate of 144 sccm), the ICP power was 25 W, the bias power was 425 W, and the pressure was 7.5 Pa.

Next, the oxide semiconductor film OS3 was etched. The etching was first performed in the following conditions: the etching gas was a mixed gas of $CH_4$ (with a flow rate of 16 sccm) and Ar (with a flow rate of 32 sccm), the ICP power was 600 W, the bias power was 100 W, the pressure was 3.0 Pa, and the substrate temperature was 70° C. Then, another etching was performed in the following conditions: the etching gas was a mixed gas of $CH_4$ (with a flow rate of 16 sccm) and Ar (with a flow rate of 32 sccm), the ICP power was 600 W, the bias power was 100 W, the pressure was 1.0 Pa, and the substrate temperature was 70° C.

Next, the resist film and the organic resin film were removed by ashing. At this stage, a gate electrode, a gate insulating layer, and the oxide semiconductor film OS3 (a second oxide layer) were obtained.

Then, as an insulating layer, an approximately 40-nm-thick aluminum oxide film and an approximately 150-nm-thick silicon oxynitride film were formed.

Through the above-described process, the sample which includes the transistor of one embodiment of the present invention was formed.

[Cross-Sectional Observation]

The cross-section of the formed sample was observed with a scanning transmission electron microscope (STEM).

Figure 11:
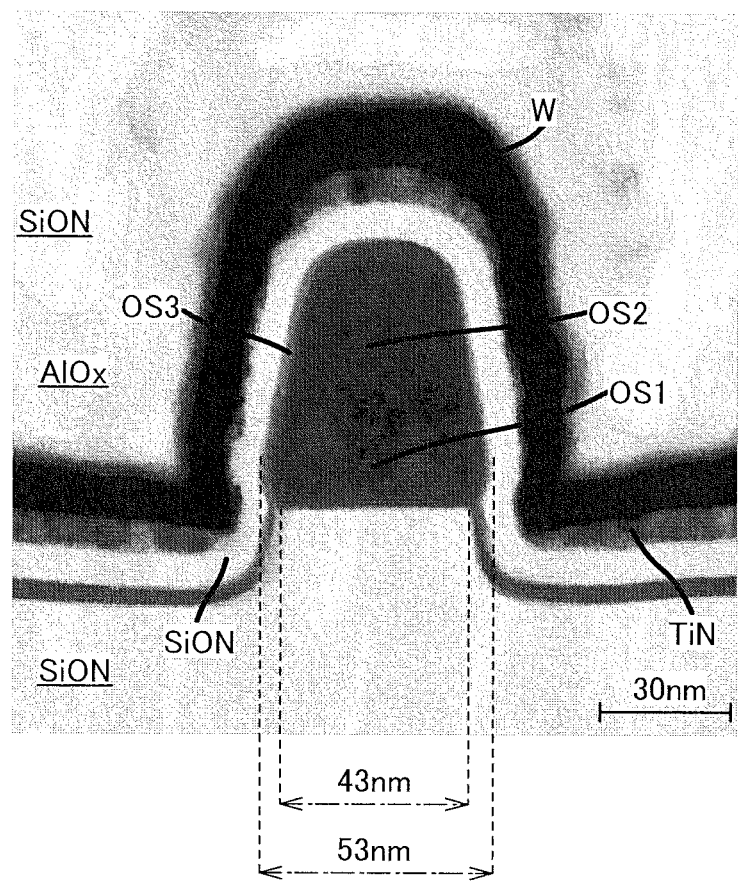
FIG. 11 is a cross-sectional image of a sample observed in Example.

The cross-sectional observation image of the transistor in the channel width direction is shown in FIG. 11. FIG. 11 is a phase contrast image (also referred to as a transmitted electron (TE) image).

FIG. 11 shows that a stack including the oxide semiconductor film OS1 and the oxide semiconductor film OS2 is in contact with the top surface of the projecting portion formed in the silicon oxynitride film positioned below the stack. In addition, the side surfaces of the projecting portion and the top surface and the side surfaces of the stack including the oxide semiconductor film OS1 and the semiconductor film OS2 are surely covered with the oxide semiconductor film OS3. Furthermore, it can be observed that the silicon oxynitride film, the titanium nitride film, and the tungsten film were stacked in this order along the surface of the oxide semiconductor film OS3.

FIG. 11 also shows that the top surface of the projecting portion of the insulating layer is positioned on an inner side of an outline of a stack including the oxide semiconductor film OS1, the oxide semiconductor film OS2, and the oxide semiconductor film OS3 when seen from above. As shown in FIG. 11, above the level of the projecting portion, the oxide semiconductor film OS3 has a maximum width of approximately 53 nm, and the top surface of the projecting portion has a width of approximately 43 nm.

In the above manner, the transistor of one embodiment of the present invention in which the gate electrode is provided to surround the top surface, the side surfaces, and the lower end portions of the semiconductor layer and to be positioned below the bottom surface of the semiconductor layer can be formed even in an extremely minute structure.

This application is based on Japanese Patent Application serial No. 2013-146297 filed with Japan Patent Office on Jul. 12, 2013, the entire contents of which are hereby incorporated by reference.

What is claimed is:

1. A semiconductor device comprising:
an insulating layer;
a metal oxide layer over the insulating layer;
a first electrode and a second electrode over and electrically connected to the metal oxide layer;
a gate electrode over the metal oxide layer; and
a gate insulating layer between the metal oxide layer and the gate electrode,
wherein the insulating layer includes a projecting portion,
wherein a top surface of the projecting portion is positioned inside an outline of the metal oxide layer when seen in a plan view,
wherein the first electrode and the second electrode cover first parts of a top surface and first parts of side surfaces of the metal oxide layer, and first side surfaces of the projecting portion,
wherein a bottom surface of the gate electrode is positioned below the top surface of the projecting portion, and
wherein the gate electrode and the gate insulating layer cover a second part of the top surface and second parts of the side surfaces of the metal oxide layer and second side surfaces of the projecting portion of the insulating layer.

2. The semiconductor device according to claim 1,
wherein the metal oxide layer comprises an oxide semiconductor.

3. the semiconductor device according to claim 1,
wherein the metal oxide layer comprises indium, gallium, and zinc.

4. The semiconductor device according to claim 1,
wherein the gate insulating layer covers part of a surface of the metal oxide layer in a downward direction.

5. The semiconductor device according to claim 1, further comprising:
a bottom oxide layer between the metal oxide layer and the insulating layer,
wherein the bottom oxide layer has a shape that is substantially aligned with a shape of the metal oxide layer when seen in the plan view.

6. The semiconductor device according to claim 1, further comprising:
a top oxide layer between the metal oxide layer and the gate insulating layer,
wherein the top oxide layer has a shape that is substantially aligned with a shape of the metal oxide layer when seen in the plan view.

7. The semiconductor device according to claim 1, further comprising:
a top oxide layer between the metal oxide layer and the gate insulating layer,
wherein the top oxide layer has a shape that is substantially aligned with a shape of the gate electrode when seen in the plan view.

8. The semiconductor device according to claim 1,
wherein the gate electrode overlaps with the first electrode and with the second electrode.

9. An electronic device comprising the semiconductor device according to claim 1.

10. A semiconductor device comprising:
an insulating layer;
a metal oxide layer over the insulating layer;
a first electrode and a second electrode over and electrically connected to the metal oxide layer;
a gate electrode over the metal oxide layer;
a gate insulating layer between the metal oxide layer and the gate electrode;
a bottom oxide layer between the insulating layer and the metal oxide layer; and
a top oxide layer between the metal oxide layer and the gate insulating layer,
wherein the insulating layer includes a projecting portion,
wherein a top surface of the projecting portion is positioned inside an outline of the metal oxide layer when seen in a plan view,
wherein the first electrode and the second electrode cover first parts of a top surface of the top oxide layer and first parts of side surfaces of the metal oxide layer, and first side surfaces of the projecting portion,
wherein a bottom surface of the gate electrode is positioned below the top surface of the projecting portion,
wherein the gate electrode and the gate insulating layer cover a second part of the top surface and second parts of the side surfaces of the metal oxide layer and second side surfaces of the projecting portion of the insulating layer, and
wherein the bottom oxide layer and the top oxide layer have a shape that is substantially aligned with a shape of the metal oxide layer when seen in the plan view.

11. The semiconductor device according to claim 10,
wherein the first electrode and the second electrode are between the gate insulating layer and the top oxide layer.

12. The semiconductor device according to claim 10,
wherein the gate insulating layer covers part of a surface of the bottom oxide layer in a downward direction.

13. The semiconductor device according to claim 10,
wherein the bottom oxide layer and the top oxide layer each contain one or more of metal elements contained in the metal oxide layer.

14. the semiconductor device according to claim 10,
wherein the bottom oxide layer, the metal oxide layer, and the top oxide layer each comprises indium, gallium, and zinc.

15. An electronic device comprising the semiconductor device according to claim 10.

16. A semiconductor device comprising:
an insulating layer;
a metal oxide layer over the insulating layer;
a first electrode and a second electrode over and electrically connected to the metal oxide layer;
a gate electrode over the metal oxide layer;
a gate insulating layer between the metal oxide layer and the gate electrode;
a bottom oxide layer between the insulating layer and the metal oxide layer; and
a top oxide layer between the metal oxide layer and the gate insulating layer,
wherein the insulating layer includes a projecting portion,
wherein a top surface of the projecting portion is positioned inside an outline of the metal oxide layer when seen in a plan view,
wherein the first electrode and the second electrode cover first parts of a top surface and first parts of side surfaces of the metal oxide layer and first side surfaces of the projecting portion, wherein a bottom surface of the gate electrode is positioned below the top surface of the projecting portion, wherein the gate electrode and the gate insulating layer cover a second part of the top surface and second parts of the side surfaces of the metal oxide layer and second side surfaces of the projecting portion of the insulating layer, wherein the bottom oxide layer has a shape that is substantially aligned with a shape of the metal oxide layer when seen in the plan view, and wherein the top oxide layer has a shape that is substantially aligned with a shape of the gate electrode when seen in the plan view.

17. The semiconductor device according to claim 16, wherein the first electrode and the second electrode are between the metal oxide layer and the top oxide layer.

18. The semiconductor device according to claim 16, wherein the top oxide layer covers part of a surface of the bottom oxide layer in a downward direction and the second side surfaces of the projecting portion.

19. The semiconductor device according to claim 16, wherein the bottom oxide layer and the top oxide layer each contain one or more of metal elements contained in the metal oxide layer.

20. the semiconductor device according to claim 16, wherein the bottom oxide layer, the metal oxide layer, and the top oxide layer each comprises indium, gallium, and zinc.

21. An electronic device comprising the semiconductor device according to claim 16.

* * * * *